(12) United States Patent
Itatani et al.

(10) Patent No.: US 7,648,578 B1
(45) Date of Patent: Jan. 19, 2010

(54) SUBSTRATE PROCESSING APPARATUS, AND METHOD FOR MANUFACTURING SEMICONDUCTOR DEVICE

(75) Inventors: Hideharu Itatani, Toyama (JP); Sadayoshi Horii, Toyama (JP); Hidehiro Yanai, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 112 days.

(21) Appl. No.: 11/547,137

(22) PCT Filed: Jun. 15, 2005

(86) PCT No.: PCT/JP2005/010954

§ 371 (c)(1),
(2), (4) Date: Dec. 8, 2006

(87) PCT Pub. No.: WO2005/124845

PCT Pub. Date: Dec. 29, 2005

(30) Foreign Application Priority Data

Jun. 15, 2004 (JP) .............................. 2004-176512

(51) Int. Cl.
*C23C 16/455* (2006.01)
*H01L 21/31* (2006.01)

(52) U.S. Cl. ..................................... 118/715; 438/778

(58) Field of Classification Search ................ 118/715; 438/778

See application file for complete search history.

(56) References Cited

U.S. PATENT DOCUMENTS

| 6,254,686 | B1 | 7/2001 | Comita et al. |
| 7,387,686 | B2 * | 6/2008 | Iwamoto et al. ............. 118/729 |
| 2003/0000473 | A1 | 1/2003 | Chae et al. |

FOREIGN PATENT DOCUMENTS

| JP | A 08-008239 | 1/1996 |
| JP | A 11-045861 | 2/1999 |
| JP | A 2000-212752 | 8/2000 |
| JP | A 2001-035797 | 2/2001 |
| JP | A 2001-179078 | 7/2001 |
| JP | A 2003-068711 | 3/2003 |
| JP | A 2004-119786 | 4/2004 |

* cited by examiner

*Primary Examiner*—Evan Pert
(74) *Attorney, Agent, or Firm*—Oliff & Berridge PLC

(57) ABSTRACT

A substrate is held by a susceptor (holding tool) in a processing chamber. A plate is provided on a periphery of the substrate. Gas supply ports are constructed to be provided on a side of the substrate and above the plate, and to supply gas to the substrate from a space above the plate. Outlets are provided at least on an upstream side and downstream side of the substrate on the plate, and are adapted to discharge the gas to a space below the plate. An exhaust port communicates with the outlets, and is provided on an opposite side to the gas supply ports with the substrate sandwiched there between and below the plate. The outlets are composed so that conductance of the upstream outlet in a gas flow between the outlets can be larger than conductance of the downstream outlet.

17 Claims, 15 Drawing Sheets

SHAPE OF CONDUCTANCE PLATE

| SHAPE No. | 1 | 2 | 3 | 4 |
|---|---|---|---|---|
| UPSTREAM GAP Gu [mm] | 5 | 6 | 7 | 8 |
| DOWNSTREAM GAP Gd [mm] | 5 | 4 | 3 | 2 |

GAS FLOW DIRECTION →

SUBSTRATE PROCESSING APPARATUS, AND METHOD FOR MANUFACTURING SEMICONDUCTOR DEVICE

BACKGROUND

The present invention relates to a substrate processing apparatus which provides a plate onto a periphery of a substrate and processes a substrate, and to a method for manufacturing a semiconductor device.

In recent years, in circumstances where a demand for a high-quality semiconductor film has been rising as a semiconductor has been being miniaturized, a film-forming method for forming a deposited film at an atomic layer level by alternately supplying two types of reaction gases has attracted attention. As materials of the reaction gases, gas containing a metal-containing material and gas containing oxygen or nitrogen are used. With regard to the film-forming method, there are two types in terms of a reaction mode. One is atomic layer deposition (ALD), and the other is metal organic chemical vapor deposition (MOCVD) to which a cyclic method is applied. A basic gas supply method is common between these methods, and accordingly, a description will be made of these methods by commonly using FIG. 14. FIG. 14(a) is a flowchart, and FIG. 14(b) is a timing chart of the gas supply. In the illustrated example, the gasified metal-containing material is defined as a material A, and the gas containing the oxygen or the nitrogen is defined as a material B.

The ALD is a method of repeating, plural times, the following four steps as one cycle, which are: a step of supplying the material A to a substrate and allowing the substrate to adsorb the material A (Step 1); a step of, after the adsorption, exhausting the residual material A (Step 2); a step of, after the exhaust, supplying the material B to the substrate and allowing the material B to react with the material A, thereby forming a film (Step 3); and a step of, after the film formation, exhausting the residual material B (Step 4). As shown in FIG. 14(b), gas supply timing is set so that exhaust by purge gas can be sandwiched between the supply of the material A and the supply of the material B, which are alternately performed.

The MOCVD to which the cyclic method is applied is a method of repeating, plural times, the following four steps as one cycle, which are: a step of supplying the material A to a substrate, thereby forming a film thereof on the substrate (Step 1); a step of, after the film formation, exhausting the material A (Step 2); a step of, after the exhaustion, supplying the material B to the substrate, thereby performing modification processing for the deposited film (Step 3); and a step of, after the modification, exhausting the residual material B (Step 4). As shown in FIG. 14(b), gas supply timing is set so that exhaust by purge gas can be sandwiched between the supply of the material A and the supply of the material B, which are alternately performed.

In general, it is frequent that reactivity between the material A and the material B is extremely high. When these materials are supplied simultaneously, there occur, owing to a gas phase reaction, generation of a foreign object and deposition of a film inferior in film quality, resulting in reduction of yield. Therefore, in the above-described Steps 2 and 4, evacuation or the purge (exhaust) by inert gas is implemented so that the materials supplied in the previous steps cannot remain. In particular, since the remaining of the materials in an upstream portion of the substrate directly affects film-forming conditions on the substrate, it is required that the purge be performed sufficiently. However, if a time required for the purge is long, then a throughput is reduced.

Meanwhile, in the above-described Steps 1 and 3, in both of the ALD and the MOCVD to which the cyclic method is applied, supplied amounts of the materials A and B onto the substrate are each made uniform, and uniformity in thickness and quality of the film formed on each substrate is enhanced. Here, each supplied amount of the materials is generally conceived to be an arithmetic function of a partial pressure (total pressure×mole fraction of material) of the material. Hence, when each partial pressure of the materials differs between an upstream side and downstream side of a flow of the gas flowing on the substrate, each adsorbed amount thereof does not become uniform, and the uniformity cannot be obtained.

As a semiconductor manufacturing apparatus for implementing the above-described film-forming method, a single wafer apparatus has become a mainstream. In order to control the film thickness highly precisely and form the high-quality film by using the single wafer apparatus, the gas supply and exhaust methods become important from a viewpoint of the above-described uniformity in film thickness and of the throughput. A gas supply/exhaust mode of the single wafer apparatus to the substrate can be broadly divided into the following two modes in terms of a construction.

As shown in FIG. 15(a), one (radial flow type) of the modes is of a method of vertically supplying the gas to a center portion of a substrate surface 43 from a gas supply port 42 on an upper portion of a substrate holding region 41 in a processing chamber 50, the substrate holding region 41 holding the substrate therein, flowing the gas on the substrate surface 43 in a radial direction, and exhausting the gas from an outer circumference of the substrate to an exhaust port 44.

As shown in FIG. 15(b), the other mode (one-side flow type) is of a method of supplying the gas to the substrate surface 43 in parallel thereto from a gas supply port 46 provided on one side of a substrate holding region 45, flowing the gas on the substrate surface 43 in a single direction, and exhausting the gas from an exhaust port 47 provided on the opposite side to the gas supply port 46.

In the case of the radial flow type in FIG. 15(a), an abnormal point in which the film is formed to be abnormally thick occurs on the center portion of the substrate, onto which the gas abuts, and the uniformity in film thickness is deteriorated. In order to avoid such a deterioration, the apparatus of this mode is modified as shown in FIG. 15(c) so that the gas can be flown from the respective holes of a shower plate 48 disposed between the gas supply port 42 and the substrate surface 43. However, a deviation occurs in the gas flow on the wafer owing to a difference in distance from the exhaust port 44 to the respective holes, and accordingly, the supply of the gas onto the substrate surface 43 cannot be made uniform, and it is difficult to ensure the uniformity in film thickness.

In this connection, in the radial flow type, heretofore, a variety thereof aiming to improve the uniformity in film thickness by adjusting conductance of the gas exhaust passage has been thought up. For example, there have been proposed: the one in which cross-sectional areas of flow passages of exhaust conductance adjustment holes on a side of a baffle plate, which is close to an exhaust hole, are made smaller than those on the opposite side in order to make the flow of the reaction gases uniform over the entire surface of the substrate (for example, refer to Japanese Patent Laid-Open Publication No. H08-8239 (published in 1996)); the one including a baffle plate, and changing an interval between baffle holes, a baffle hole diameter, a baffle plate thickness, a slit width, and the like, and so on, thereby being adapted to flow out the exhaust gas in a radius direction at a uniform flow rate free from an uneven distribution over the entire circumferential angle of the wafer (for example, refer to Japanese Patent Laid-Open Publication No. 2001-179078); the one changing an opening distribution of an exhaust passage by moving a baffle plate, thereby changing each exhaust conductance of an exhaust port and an opposite side thereto, thereby adjusting a pressure distribution in a processing space (for example, refer to Japanese Patent Laid-Open Publication No. 2003-68711); and the like.

SUMMARY

In each apparatus described in the above noted JP H08-8239, JP 2001-179078, and JP 2003-68711, the pressure distribution in the processing space is adjusted by the baffle plate, and accordingly, the pressure on the substrate is equalized over the substrate concerned, thus making it possible to improve the uniformity of the film thickness.

However, each apparatus is of the radial flow type which supplies the processing gas by the shower plate, and accordingly, an upstream region of the shower plate increases a pressure thereof, and it will take a time to exhaust the residual gas in the purging step. Moreover, to the exhaust port and the conductance adjusting opening on the opposite side, it is necessary to flow the gas toward a direction opposite to the exhaust port, and the residual gas cannot be removed efficiently. Then, the gas resides in a space below the baffle plate, and is adsorbed to an inner wall of the space, which is conceived to cause particle generation. Specifically, it is conceived that the apparatuses described in above noted JP H08-8239, JP 2001-179078, and JP 2003-68711 cannot perform rapid exhaust and deteriorate purging efficiency thereof.

When the purging efficiency is poor, in processing for which high purging efficiency is required, for example, in cyclic processing such as the ALD which frequently performs the purging and the MOCVD to which the cyclic method is applied, it takes a time to exhaust the residual gases in Steps 2 and 4 of the above-described film-forming method, and accordingly, this will cause reduction of the throughput. Note that it is also conceived that, in order to shorten the exhaust time, an interval between the shower plate and the wafer is narrowed, and a reaction capacity is reduced. However, when the reaction capacity is reduced, marks of pores of the shower plate are transferred onto the wafer, and it becomes difficult to ensure the uniformity in film thickness.

Hence, it has been difficult to apply the radial flow type to the cyclic processing.

In this connection, with regard to the application of the single wafer apparatus to the cyclic processing, the one-side flow type with good purging efficiency is selected more frequently than the radial flow type.

However, even in the case of the one-side flow type, when the gas flows on the substrate in the single direction, the gas pressure on the upstream side of the flow thereof rises, and the gas pressure on the downstream side thereof drops, which has resulted in a drawback that uniformity in substrate processing cannot be obtained. Moreover, when the exhaust port communicates with the space above the wafer, there has been a problem that the particles from the exhaust port run back and are dispersed on the wafer.

The exemplary embodiments provide a substrate processing apparatus of a type which exhausts gas from an opposite side to a gas supply side with a substrate sandwiched therebetween while supplying the gas from a side of the substrate, the substrate processing apparatus capable of solving the above-described problems inherent in the conventional technology and capable of, in the case of performing purging of residual gas in a processing chamber, efficiently removing the residual gas while ensuring the uniformity in substrate processing.

In the substrate processing apparatus of the type which exhausts the gas from the opposite side to the gas supply side with the substrate sandwiched therebetween while supplying the gas from the side of the substrate, in order to suppress the particle generation, it is originally preferable that the reaction gases be flown only on the substrate. However, when the gases are flown on the substrate only in the single direction, the gas pressure on the upstream side of the flow thereof rises, the gas pressure on the downstream side thereof drops, and the uniformity in the substrate processing cannot be obtained.

In this connection, the inventor discovered the following finding. The finding is that, when a plate is provided on a periphery of the substrate, a part of the gases flowing on the substrate is adapted to be exhausted to the space below the plate, and conductance of the upstream outlet is made larger than conductance of the downstream outlet, then it can be relieved that the pressure on the upstream side on the substrate rises and that the pressure on the downstream side thereon drops, and in addition, purging efficiency in the space below the plate is increased in the case of purging the residual gases.

In an exemplary embodiment a substrate processing apparatus includes a processing chamber which processes a substrate; a holding tool which holds the substrate in the processing chamber; a plate provided on a periphery of the substrate; a supply port which is provided on a side of the substrate to communicate with a space above the plate, and supplies gas to the substrate; outlets which are provided at least on an upstream side and downstream side of the substrate on the plate, and discharge the gas to a space below the plate; and an exhaust port which is provided on an opposite side to the supply port with the substrate sandwiched therebetween, communicates with the space below the plate, and exhausts the gas in the processing chamber, wherein the outlets are composed so that conductance of the upstream outlet can be larger than conductance of the downstream outlet.

The gas is supplied to the substrate from the supply port provided on the side of the substrate to communicate with the space above the plate. The exhaust port is provided to communicate with the space on the opposite side to the supply port with the substrate sandwiched therebetween and below the plate. Accordingly, the gas supplied to the space above the plate flows on the substrate in the single direction along the plate. Moreover, the outlets are provided on the upstream side and downstream side of the substrate on the plate, and accordingly, a part of the supplied gas is discharged from the upstream outlet to the space below the plate without flowing on the substrate. The rest of the gas flows on the substrate, and is then discharged from the downstream outlet to the space below the plate. The gas thus discharged is exhausted from the exhaust port which communicates with the space below the plate. As described above, the gas is exhausted from the processing chamber while being supplied thereto, and the substrate is thereby processed.

In the exemplary embodiment, the outlets are composed so that the conductance of the upstream outlet can be larger than the conductance of the downstream outlet. Therefore, a flow passage resistance on the upstream side becomes smaller than that on the downstream side, and it becomes easier for the gas to be discharged from the upstream outlet than from the downstream outlet. Thus, it is relieved that the gas pressure on the upstream side rises and that the gas pressure on the downstream side drops, the pressure distribution on the substrate is made uniform, and the uniformity in the substrate processing is enhanced.

Moreover, the outlets are composed so that the upstream outlet can have larger conductance than the downstream outlet, and accordingly, in the case of purging the residual gas in the processing chamber, a larger amount of purge gas than from the downstream outlet is discharged from the upstream outlet to the space below the plate. Hence, the purge gas is supplied from the upstream side to the entire space below the plate, and accordingly, the purging efficiency is enhanced. As a result, the residual gas which resides in the space below the plate and is adsorbed to the inner wall of the space concerned can be removed efficiently.

As the substrate, a silicon substrate is mentioned. As a method for processing the substrate, there are mentioned ALD which alternately supplies two or more types of gases to deposit a film, MOCVD to which a cyclic method is applied, usual MOCVD which simultaneously supplies the two or more types of gases to deposit the film, and the like. As processing contents for the substrate, film forming of a metal oxide film, and the like, are mentioned. As the processing chamber, the one of a single wafer type is mentioned. As the holding tool, a susceptor which heats up the held substrate is mentioned. As the plate provided on the periphery of the substrate, a conductance plate which adjusts the conductance of the outlets is mentioned. As the gas, there are mentioned gas containing a metal-containing material and gas containing oxygen or nitrogen. It is not necessary to provide a shower plate on the supply port which supplies the gas. The outlets can also be provided between the plate and the processing chamber wall, between the plate and the substrate, or in any position of the region of the plate, or alternatively, can also be provided by arbitrarily combining these. As the substrate processing apparatus, a semiconductor manufacturing apparatus having the processing chamber of the single wafer type is mentioned.

In another exemplary embodiment, the outlet on the upstream side of the substrate is provided between the supply port and the substrate.

When the outlet on the upstream side is provided between the supply port and the substrate, that is, on the side downstream of the supply port and upstream of the substrate, a portion where the gas is flown opposite to the exhaust port is eliminated, a larger amount of the purge gas can be smoothly discharged from the outlets to the entire space below the plate, and the purging efficiency is further enhanced.

In another exemplary embodiment, the supply port is provided on an outside of the plate, the outside being an opposite side to the exhaust port.

When the supply port is provided on the outside of the plate, the gas discharged from the upstream outlet to the space below the plate can be flown thereinto from the most upstream side of the space concerned. Accordingly, the purging efficiency is further enhanced, and the reaction gas which resides in the space concerned and is adsorbed to the inner wall of the space concerned can be removed more efficiently.

In another exemplary embodiment, the outlets are composed of openings provided in the plate.

When the outlets are composed of the openings provided in the plate, the conductance of the outlets can be easily adjusted only by adjusting the upstream opening area and the downstream opening area. Specifically, only by increasing the upstream opening area more than the downstream opening area, the outlets can be composed so that the conductance of the upstream outlet can be larger than that of the downstream outlet.

In another exemplary embodiment, the outlets are composed of gaps formed between the plate and a wall of the processing chamber.

When the outlets are composed of the gaps between the plate and the processing chamber wall, the outlets can be composed so that the conductance of the upstream outlet can be larger than that of the downstream outlet only by shifting a position of the plate so that the upstream gap can be large and that the downstream gap can be small.

In another exemplary embodiment, an opening area of the upstream outlet is larger than an opening area of the downstream outlet.

The opening area of the upstream outlet is larger than the opening area of the downstream outlet, and the outlets can be thus composed so that the conductance of the upstream outlet can be larger than that of the downstream outlet.

In another exemplary embodiment a length of a flow passage of the upstream outlet is shorter than a length of a flow passage of the downstream outlet.

The length of the flow passage of the upstream outlet is shorter than the length of the flow passage of the downstream outlet, and the outlets are thus composed so that the conductance of the upstream outlet can be larger than that of the downstream outlet.

The exemplary embodiments are further directed to the substrate processing apparatus further including controlling means for performing a control to alternately supply two or more types of reaction gases from the supply port plural times and to sandwich supply of purge gas between the alternate supplies of the two or more types of reaction gases.

Even in such processing for which high purging efficiency is required as performing the control to alternately supply the two or more types of reaction gases from the supply port, and to alternately supply the reaction gases plural times while sandwiching the supply of the purge gas therebetween, the reaction gases which reside in the space below the plate and are adsorbed to the inner wall of the space concerned can be removed efficiently.

In another exemplary embodiment, at least two or more of the outlets are provided at least on the downstream side of the substrate on the plate, and the outlets are arrayed at an interval toward a gas flow direction.

When the at least two or more outlets are provided on the downstream side on the plate, and the outlets are arrayed at an interval toward the gas flow direction, a gas flow can be positively formed in portions where gas stagnation occurs. Accordingly, a portion on the plate, where a gas flow velocity is decreased, can be solved.

The exemplary embodiments are also directed to a substrate processing apparatus including a processing chamber which processes a substrate; a holding tool which holds the substrate in the processing chamber; a plate provided on a periphery of the substrate; a supply port which is provided on a side of the substrate to communicate with a space above the plate, and supplies gas to the substrate; outlets which are provided at least on an upstream side and downstream side of the substrate on the plate, and discharge the gas to a space below the plate; and an exhaust port which is provided on an opposite side to the supply port with the substrate sandwiched therebetween, communicates with the space below the plate, and exhausts the gas in the processing chamber, wherein the outlet provided at least on the downstream side of the substrate on the plate includes at least a first outlet, and a second outlet provided downstream of the first outlet.

The gas is supplied to the substrate from the supply port which is provided on the side of the substrate to communicate with the space above the plate. The exhaust port is provided so as to communicate with the space on the opposite side to the supply port and below the plate. Accordingly, the gas supplied to the space above the plate flows on the substrate in the single direction along the plate. Moreover, the outlets are provided at least on the upstream side and downstream side of the substrate on the plate, and the outlet at least on the downstream side of the substrate includes the first outlet, and the second outlet provided downstream of the first outlet. Accordingly, a part of the supplied gas is discharged from the outlet provided on the upstream side to the space below the plate without flowing on the substrate. The rest of the gas flows on the substrate, and is then discharged from the first and second outlets provided on the downstream side to the space below the plate. The gas thus discharged is exhausted from the exhaust port which communicates with the space below the plate. As described above, the gas is exhausted from the processing chamber while being supplied thereto, and the substrate is thereby processed.

The outlet provided at least on the downstream side of the substrate on the plate includes the first outlet, and the second outlet provided on the downstream side of the first outlet. Accordingly, gas flow ranges in both of the space above the plate and the space below the plate in the processing chamber are widened, and stagnation in the respective spaces is eliminated. Accordingly, purging efficiencies of the respective spaces are enhanced. As a result, the residual gas which resides in the space below the plate and is adsorbed to the inner wall of the space concerned can be removed efficiently. As a result, the reaction gases which reside in the respective spaces and are adsorbed to inner walls of the spaces concerned can be removed efficiently.

In another exemplary embodiment, a method for manufacturing a semiconductor device includes carrying a substrate into a processing chamber; while supplying gas to the substrate along a plate provided on a periphery of the substrate from a side of the substrate carried into the processing chamber, discharging the gas from outlets provided at least on an upstream side and downstream side of the substrate on the plate to a space below the plate, and exhausting the gas from an opposite side in a space below the plate, the opposite side being opposite to a supply side with the substrate sandwiched therebetween, thereby processing the substrate; and carrying out the processed substrate from the processing chamber, wherein, in the step of processing the substrate, conductance of the upstream outlet is made larger than conductance of the downstream outlet.

The gas flows from the side of the substrate onto the substrate in the single direction along the plate. Moreover, the outlets are provided on the upstream side and downstream side of the substrate on the plate. Accordingly, a part of the supplied gas is discharged from the upstream outlet to the space below the plate without flowing on the substrate. The rest of the gas flows on the substrate, and is then discharged from the outlet on the downstream side to the space below the plate. The gas thus discharged is exhausted from the opposite side to the supply side with the substrate sandwiched therebetween in the space below the plate. As described above, the gas is exhausted from the processing chamber while being supplied thereto, and the substrate is thereby processed.

The outlets are composed so that the conductance of the upstream outlet can be made larger than the conductance of the downstream outlet. Therefore, a flow passage resistance on the upstream side becomes smaller than that on the downstream side, and it becomes easier for the gas to be discharged from the upstream outlet than from the downstream outlet. Thus, it is relieved that the gas pressure on the upstream side rises and that the gas pressure on the downstream side drops, the pressure distribution on the substrate is made uniform, and the uniformity in the substrate processing is enhanced.

Moreover, the outlets are composed so that the conductance of the upstream outlet can be made larger than the conductance of the downstream outlet, and accordingly, in the case of purging the residual gas in the processing chamber, a larger amount of purge gas than from the downstream outlet is discharged from the upstream outlet to the space below the plate. Hence, the purge gas is supplied from the upstream side to the entire space below the plate, and accordingly, the purging efficiency is enhanced. As a result, the residual gas which resides in the space below the plate and is adsorbed to the inner wall of the space concerned can be removed efficiently.

In another exemplary embodiment, in the processing the substrate, two or more types of reaction gases are alternately supplied to the substrate plural times, and supply of purge gas is sandwiched between the alternate supplies of the two or more types of reaction gases.

Even in such processing for which high purging efficiency is required as alternately supplying the two or more types of reaction gases plural times while sandwiching the supply of the purge gas therebetween, the reaction gases which reside in the space below the plate and are adsorbed to the inner wall of the space concerned can be removed efficiently.

In another exemplary embodiment, the processing the substrate includes adsorbing at least one type of reaction gas onto the substrate; and supplying reaction gas different from the adsorbed reaction gas thereto, thereby generating a film-forming reaction.

Even in such processing for which high purging efficiency is required as alternately supplying the reaction gas for use in the adsorption step and the reaction gas for use in the step of generating the film-forming reaction plural times while sandwiching the supply of the purge gas therebetween, the reaction gas for use in the adsorption step and the reaction gas for use in the step of generating the film-forming reaction can be removed efficiently.

In another exemplary embodiment, the processing the substrate repeats, plural times, the step of supplying first reaction gas to the substrate and adsorbing the first reaction gas onto the substrate, the step of subsequently performing purge, the step of subsequently supplying second processing gas to the first reaction gas adsorbed onto the substrate, thereby generating a film-forming reaction; and the step of subsequently performing purge.

Even in such processing as the ALD, in which the purge is frequently performed, the first reaction gas for use in the adsorption step and the second reaction gas for use in the film-forming step can be removed efficiently.

In another exemplary embodiment, the processing the substrate includes decomposing at least one type of reaction gas and depositing a thin film on the substrate; and supplying reaction gas different from the reaction gas to the deposited thin film and modifying the thin film.

Even in such processing for which high purging efficiency is required as alternately supplying the reaction gas for use in the deposition step and the reaction gas for use in the modification step plural times while sandwiching the supply of the purge gas therebetween, the reaction gases for use in the deposition step and the modification step can be removed efficiently.

In an exemplary embodiment, the processing the substrate repeats, plural times, the step of supplying first reaction gas to the substrate and depositing a thin film on the substrate, the step of subsequently performing purge, the step of subsequently supplying second reaction gas to the thin film deposited on the substrate and modifying the thin film, and the step of subsequently performing purge.

Even in such processing as the MOCVD to which the cyclic method is applied, in which the purge is frequently performed, the first reaction gas for use in the deposition step and the second reaction gas for use in the modification step can be removed efficiently.

In an exemplary embodiment, a plurality of the outlets are provided at least on the downstream side of the substrate on the plate, the plurality of outlets are arrayed at an interval toward a gas flow direction, and the gas is discharged from the plurality of outlets in the step of processing the substrate.

When the plurality of outlets are provided on the downstream side of the substrate on the plate, and the plurality of outlets are arrayed at an interval toward the gas flow direction, a gas flow can be positively formed in portions where gas stagnation occurs. Accordingly, a portion on the plate, where a gas flow velocity is decreased, can be solved.

Accordingly, the uniformity in the substrate processing can be ensured. At the same time, in the case of performing the purge for the residual gas in the processing chamber, the residual gas does not reside in the space below the plate, and is not adsorbed to the inner wall of the space, and accordingly, the residual gas can be removed efficiently.

BRIEF DESCRIPTION OF THE DRAWINGS

FIG. 9 is explanatory views showing a shape of a conductance plate according to a modification example of the embodiment.

FIG. 10 is plan views of conductance plates showing the embodiment.

FIGS. 12(a) and 12(b) show modification examples of a plate of a type which has the outlets only on an inside; and FIG. 12(c) shows a modification example of a plate of a type which has the outlets also on an outside.

FIG. 14 is explanatory views of a gas supply method common to ALD and MOCVD to which a cyclic method is applied.

FIG. 15 is explanatory views showing general gas supply modes of a single wafer apparatus to the substrate.

DETAILED DESCRIPTION OF THE INVENTION

A description will be made below of an embodiment of the present invention.

Figure 1:
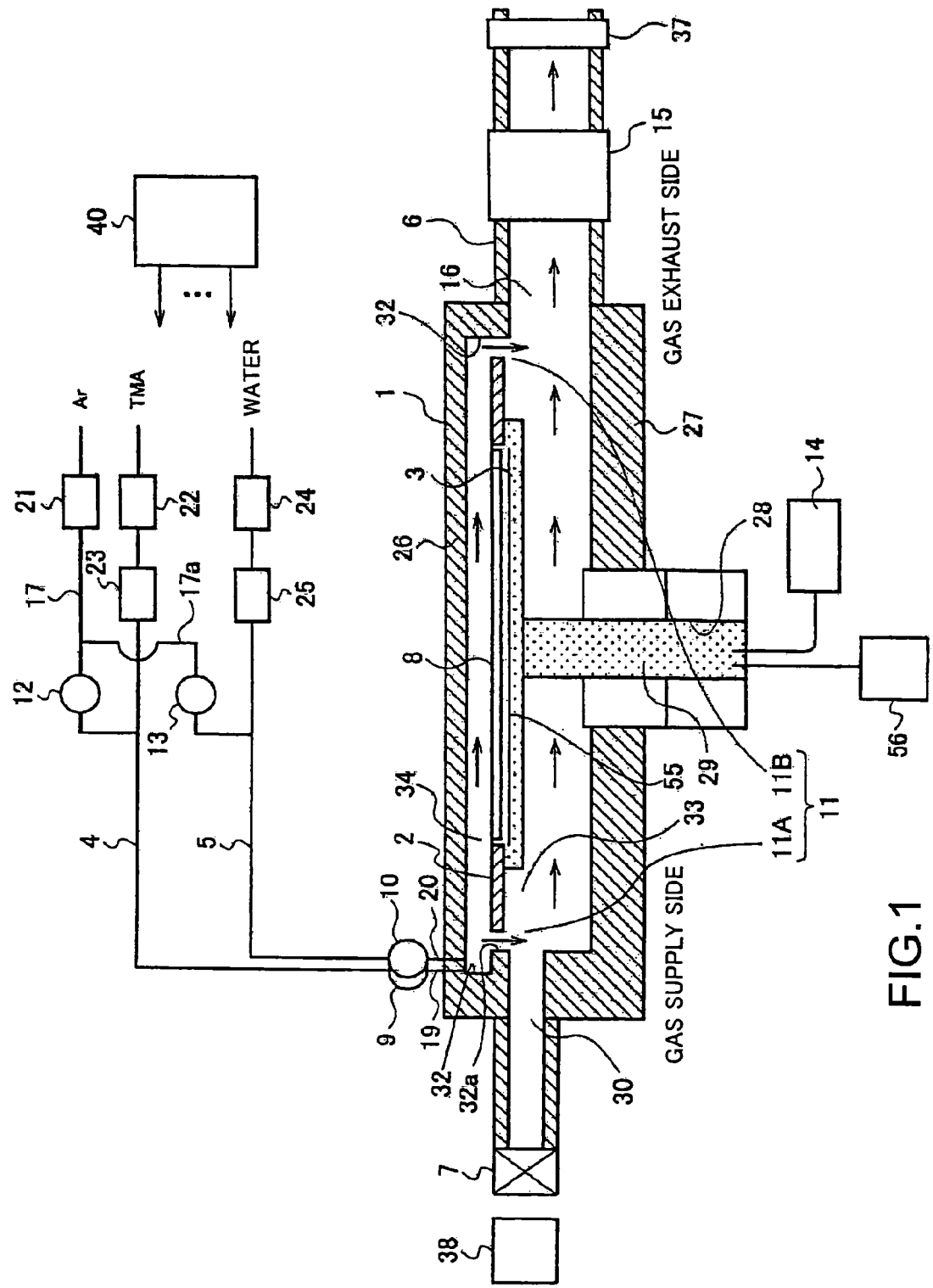
FIG. 1 is a longitudinal cross-sectional view of a processing chamber of a substrate processing apparatus according to an embodiment.
Figure 2:
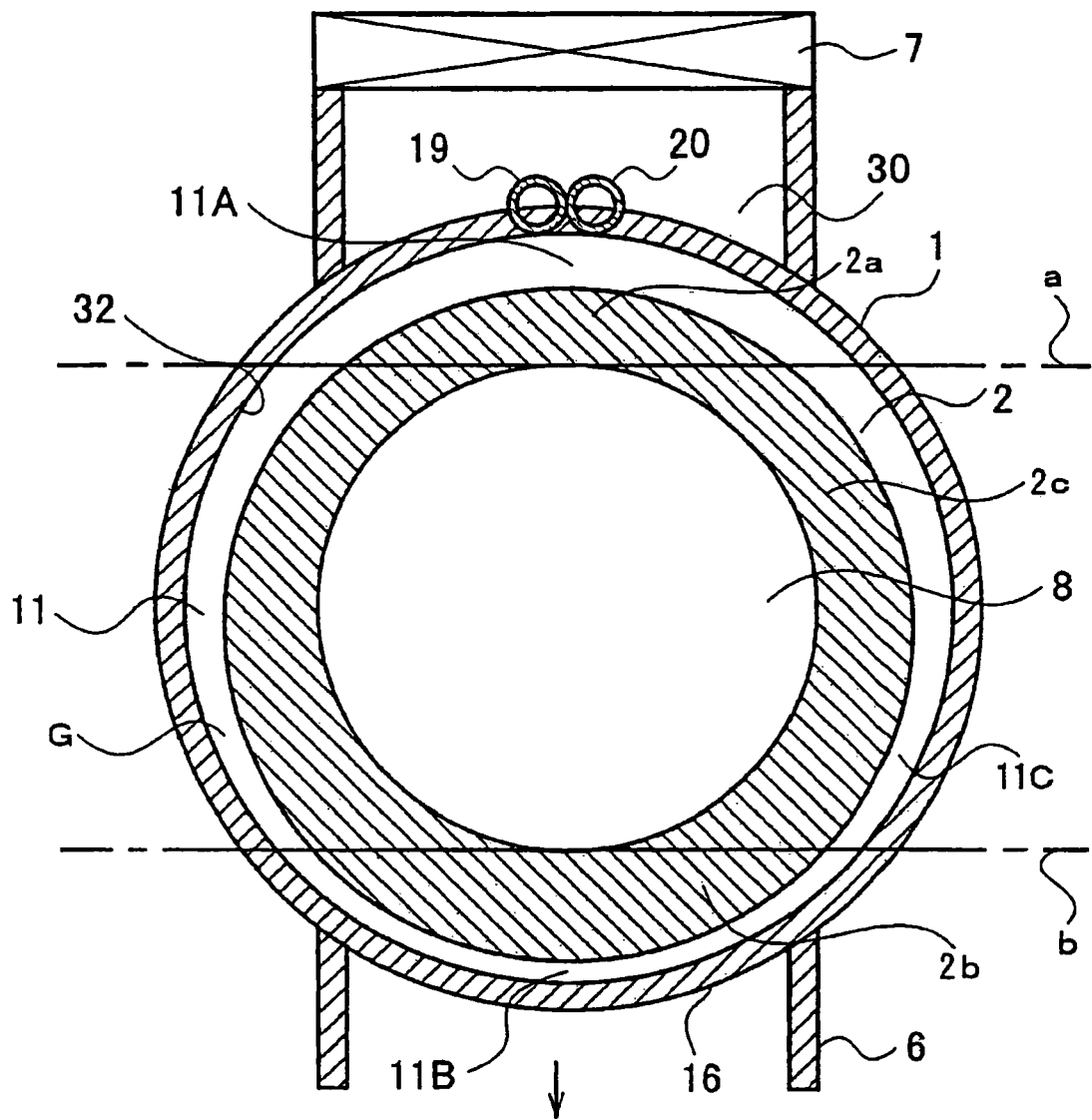
FIG. 2 is a plan cross-sectional view of an inside of the processing chamber of the substrate processing apparatus according to the embodiment.

FIG. 1 is a longitudinal cross-sectional view of a substrate processing apparatus of a single wafer type according to this embodiment, and FIG. 2 is a plan cross-sectional view of an inside of a processing chamber constructing the same substrate processing apparatus when viewed from the above.

As shown in FIG. 1, the substrate processing apparatus mainly includes: a flat processing chamber 1 which processes, for example, one silicon substrate 8 in a substantially horizontal posture in an inside thereof; gas supply ports 19 and 20 which supply gases to the substrate 8 in the processing chamber 1; an exhaust port 16 which exhausts the gases in the processing chamber 1; a susceptor 3 as a holding tool which holds the substrate 8 substantially horizontally; a conductance plate 2 (hereinafter, sometimes also referred to as a plate 2 simply) supported substantially horizontally on a periphery of the substrate 8 held on the susceptor 3; and outlets 11 which discharge the gases to a space below the conductance plate 2. Here, the space 33 below the plate 2 also includes a space below the substrate, that is, a space on a backside of the susceptor 3.

The processing chamber 1 is composed of an upper container 26 and a lower container 27, and is constructed so as to process the substrate 8 in a hermetically sealed inner space.

In the upper container 26, plural supply ports which supply the gases to the substrate 8, for example, the two gas supply ports 19 and 20 are provided. The gas supply ports 19 and 20 are provided not above a substrate holding region where the substrate 8 is held but on a side of the substrate 8, which is out of the substrate holding region where the substrate 8 is held, and in addition, on an outside of the plate 2 provided on the periphery of the substrate 8 and above a surface level of the plate 2.

The gas supply ports 19 and 20 communicate with a space 34 above the plate 2 in the processing chamber 1. The gas supply port 19 is constructed so as to selectively supply first reaction gas or purge gas in the processing chamber 1. The gas supply port 20 is provided adjacent to the gas supply port 19, and is constructed so as to selectively supply second reaction gas or purge gas into the processing chamber 1. To the gas supply ports 19 and 20, two channel lines for supplying the gases are individually coupled. One of the channels is a TMA supply line 4 which supplies $Al(CH_3)$: trimethylaluminum (TMA) as an organic liquid material of a metal oxide film, for example, of an aluminum oxide film, and the other channel is a water supply line 5 which supplies, for example, water as gas highly reactive with the material.

In the TMA supply line 4, there are provided: liquid flow rate controlling means 22 for controlling a flow rate of the TMA liquid; evaporating means 23 for evaporating the TMA liquid of which flow rate is controlled; and a valve 9 which opens/closes the line 4. An Ar supply line 17 is connected between the evaporating means 23 and valve 9 of the TMA supply line 4, and is composed so as to make it possible to supply Ar gas of which flow rate is controlled by flow rate controlling means 21 to the TMA supply line 4 through a valve 12.

With such a construction, it is made possible to select the following three ways with regard to gas introduction to the supply port 19. (1) The valve 9 of the TMA supply line 4 is opened, the valve 12 of the Ar supply line 17 is closed, and only the TMA gas evaporated by the evaporating means 23 is thus introduced singly from the TMA supply line 4 to the supply port 19. (2) Moreover, the valve 12 of the Ar supply line 17 is opened, and mixed gas of the TMA gas and the Ar gas is thus introduced from the TMA supply line 4 to the supply port 19. (3) The TMA gas from the evaporating means 23 is stopped, and only the Ar gas from the TMA supply line 4 is introduced singly to the supply port 19.

In the water supply line 5, there are provided; liquid flow rate controlling means 24 for controlling a flow rate of the water; evaporating means 25 for evaporating the water of which flow rate is controlled; and a valve 10 which opens/closes the line 5. Between the evaporating means 25 and valve 10 of the water supply line 5, the above-described Ar supply line 17 is connected in a branched manner by a branch line 17a, and is composed so as to make it possible to supply the Ar gas of which flow rate is controlled by the flow rate controlling means 21 to the water supply line 5 through a valve 13.

With such a construction, it is made possible to select the following three ways with regard to gas introduction to the supply port 20. (1) The valve 10 of the water supply line 5 is opened, the valve 13 of the branch line is closed, and only the water vapor evaporated by the evaporating means 25 is thus introduced singly from the water supply line 5. (2) Moreover, the valve 13 of the branch line is opened, and mixed gas of the water vapor and the Ar gas is introduced from the water supply line 5 to the supply port 20. (3) The water vapor from the evaporating means 25 is stopped, and only the Ar gas from the water supply line 5 is introduced singly to the supply port 20.

The exhaust port 16 is provided on a one-side wall of the lower container 27. The exhaust port 16 is located on an opposite side to the gas supply ports 19 and 20 while sandwiching the substrate 8 held substantially horizontally therebetween in a substantially horizontal direction, and opens to the space 33 below the plate 2. Thus, the exhaust port 16 communicates with the outlets 11 through the space 33 below the plate 2. The exhaust port 16 is connected to a gas exhaust line 6 as an exhaust pipe which provides pressure controlling means 15 and a vacuum pump 37 therethrough, and is adapted to discharge the atmosphere in the processing chamber 1. The inside of the processing chamber 1 is adapted to be controllable at a predetermined pressure by the pressure controlling means 15. Note that the pressure controlling means 15 does not have to be used.

Moreover, on the other-side wall opposite to the one-side wall of the lower container 27, a substrate delivery port 30 is provided. A gate valve 7 is provided on an opening of an extended portion extended from the substrate delivery port 30 to the outside. The substrate 8 is adapted to be transferable to/from the processing chamber 1 through the gate valve 7 from the substrate delivery port 30 by a transfer robot 38 as transferring means.

The upper container 26 and the lower container 27 are composed of metal, for example, such as aluminum and stainless steel.

The susceptor 3 is provided in the processing chamber 3, is formed into a disc shape, and is constructed so as to hold the substrate 8 thereon. The susceptor 3 builds therein a heater 55 such as a ceramic heater to heat up the substrate 8 to a predetermined temperature, and is constructed so as to support the plate 2 on an outer circumference of the held substrate 8. The susceptor 3 includes a support shaft 29. The support shaft 29 is inserted in a vertical direction from a through hole 28 provided on a bottom center of the lower container 27 of the processing chamber 1, and is adapted to vertically move the susceptor 3 by an elevator mechanism 56. Film-forming processing is performed at a film-forming position (illustrated position) where the susceptor 3 is located above, and the substrate 8 is transferred at a standby position where the susceptor 3 is located below. When the susceptor 3 which holds the plate 2 is located at the above-described film-forming position, the space 34 above the plate 2 and the space 33 below the plate 2 are formed in upper and lower portions in the processing chamber 1 by the plate 2, the substrate 8, and the susceptor 3, which vertically partition the inside of the processing chamber 1.

The susceptor is composed of, for example, quartz, carbon, ceramics, silicon carbide (SiC), aluminum oxide ($Al_2O_3$), aluminum nitride (AlN), or the like.

The conductance plate 2 is provided on the periphery of the substrate 8, and is constructed so as to control a flow of the gas flowing on the substrate. Here, the conductance plate 2 is supported on an outer circumference of the susceptor 3 so as to project from the susceptor 3 toward a processing chamber inner wall 32. Moreover, the plate 2 is provided so that a surface thereof and a surface of the substrate 8 can be flush with each other. Alternatively, the plate 2 is provided so as to be fixed to the upper container 26 and so that the plate 2 and the substrate 8 can be flush with each other as a result that the substrate 8 ascends together with the susceptor 3. Thus, the reaction gas or the purge gas (hereinafter, sometimes also referred to as gas simply) can be adapted to be uniformly supplied onto the substrate surface in parallel thereto.

Moreover, on an outer circumference of the conductance plate 2, the outlets 11 which discharge the gases to the space 33 below the conductance plate 2 are provided. Each exhaust conductance of the outlets 11 is adapted to be adjustable by shifting the position of the plate 2 or by changing the shape of the plate 2. Note that, in the illustrated example, thickness of the plate 2 is somewhat thicker than that of the substrate 8; however, may be the same thickness as the thickness of the substrate 8, or may be thinner than that of the substrate 8. The plate 2 is composed of, for example, ceramics.

The outlets 11 are conductance adjusting openings, and control an amount of the gas discharged from the space 34 above the plate 2 through the outlets 11 concerned to the space 33 below the plate 2, thereby controlling a gas pressure of the gas supplied onto the substrate 8.

The outlets 11 are provided at least on an upstream side and downstream side of the substrate 8 on the plate 2 in the gas flow, and are adapted so as to discharge the gas from the space 34 above the plate 2 to the space 33 below the plate 2 through the upstream outlet 11A and the downstream outlet 11B.

The reason that the outlets 11 are provided on the upstream side and the downstream side of the plate 2 is because this is effective means for controlling the gas flow by adjusting the conductance of each outlet on the upstream side and the downstream side, thereby making a pressure distribution on the substrate 8 uniform.

Moreover, the reason that the outlets 11 are provided so as to discharge the gas to the space 33 below the plate 2 is because, in the gas supplied to the gas supply ports 19 and 20, the amount of gas flowing to the space 33 below the plate 2 is changed with respect to the gas flowing to the space 34 above the plate 2, thus making it possible to control the pressure distribution on the substrate, and to enhance purging efficiency of the space 33 below the plate 2.

The outlets 11 according to this embodiment are constructed to be provided continuously on the outer circumference of the plate 2. Specifically, the outlets 11 are formed as an annular gap between the processing chamber inner wall 32 and the outer circumferential portion of the plate 2. An arrangement relationship among the processing chamber inner wall 32 and the plate 2, which form the annular gap, and the substrate 8 is shown in FIG. 2.

As shown in FIG. 2, a processing chamber wall constructing the processing chamber 1 forms a circular shape in cross section. The substrate delivery port 30 is provided on the one-side wall of the processing chamber wall, and the gate valve 7 is provided on the opening on the side portion of the substrate delivery port 30 extended outward. The exhaust port 16 is provided on the other-side wall of the processing chamber 1 on the opposite side of the processing chamber 1, on which the substrate delivery port 30 is provided, and to the exhaust port 16, the gas exhaust line 6 is connected. The above-described supply ports 19 and 20 are provided adjacent to each other on an upper wall of the processing chamber, which corresponds to an approximate center portion of the substrate delivery port 30.

The plate 2 provided in the processing chamber 1 is formed into an annular shape, and the substrate 8 held on the susceptor 3 is adapted to just fit on a hole of the annular shape. Since the plate 2 is formed into the annular shape, as described above, the outlets 11 are composed as the annular gap G formed between the outer circumferential portion of the plate 2 and the processing chamber inner wall 32. Hence, the outlets 11 composed of the annular gap G are provided not only on the upstream side and downstream side of the substrate 8 on the plate 2 in the gas flow but also over the entire circumference of the plate 2.

Here, the upstream side of the substrate 8 in the gas flow refers to an upstream side of a virtual line a perpendicular to the gas flow and in contact with the outer circumference of the substrate 8 on the supply ports 19 and 20 side, and the downstream side of the substrate 8 in the gas flow refers to a downstream side of a virtual line b perpendicular to the gas flow and in contact with the outer circumference of the substrate 8 on the exhaust port 16 side. Hence, the upstream side of the substrate 8 on the plate 2 refers to a plate portion 2a present on the upstream side of the virtual line a. Moreover, the downstream side of the substrate 8 on the plate 2 refers to a plate portion 2b present on the downstream side of the virtual line b. Moreover, when a portion between the two virtual lines a and b is referred to as a midstream side with respect to the upstream side and downstream side of at least the substrate 8 on the plate 2, the plate 2 also includes not only the upstream-side and downstream-side plate portions but also a midstream-side plate portion 2c.

In the illustrated example, though the substrate 8 is arranged in the processing chamber 1 concentrically with the processing chamber inner wall 32, the plate 2 is shifted from such a concentric arrangement. A center of the plate 2 is shifted close to the exhaust port 16 with respect to a center of a circle of the processing chamber inner wall 32. Thus, the outlets 11 are composed so that an opening area of the gap of the annular outlets 11 can be gradually increased from the exhaust port 16 side toward the gas supply ports 19 and 20 side. Since the conductance of the outlets 11 is determined depending on the opening area of the gap G, the outlets 11 communicating with the space 33 below the plate 2 will be composed so that the conductance of the outlets 11 can be gradually increased more on the upstream side than on the downstream side.

Here, returning to FIG. 1, a description will be made of the gas flow in the processing chamber 1. As illustrated, in the processing chamber inner wall 32, on a portion of the inner wall 32, which is immediately under the gas supply ports 19 and 20, a protruding inner wall 32a which protrudes inward is provided on a spot of the portion, which becomes flush with a surface of the plate. The upstream outlet 11A is provided between the protruding inner wall 32a and the outer circumferential portion of the plate 2, which is opposite to the protruding inner wall concerned. The gases which have flown from the gas supply ports 19 and 20 into the space 34 above the plate 2 in the processing chamber 1 collide with the protruding inner wall 32a, and a direction thereof is changed. A part of the gases flows from the upstream outlet 11A into the space 33 below the plate 2 as shown by an arrow, and then flows under the substrate in a single direction toward the exhaust port 16. The rest of the gases flows onto the substrate 8 along the upstream plate 2 toward the exhaust port 16 as shown by arrows in a single direction.

As described above, the protruding inner wall 32a which receives and flows the gases is provided immediately under the gas supply ports 19 and 20, thus enabling the gases supplied to the space 34 above the plate 2 to flow along the plate 2 on the substrate 8 in parallel thereto though the gas supply ports 19 and 20 are provided on the upper portion of the upper container 26 of the processing chamber 1.

Then, at the exhaust port 16, there meet together the gas flown on the substrate 8, passing through the downstream plate 2, and discharged from the downstream outlet 11B to the space 33 below the plate 2, and the gas discharged from the upstream exhaust port 11A into the space 33 below the plate 2 and flown under the susceptor 3. Then, the gases are exhausted from the gas exhaust line 6.

As described above, the substrate processing apparatus of this embodiment is constructed.

Next, a description will be made of a method for processing the substrate, as one process of processes for manufacturing a semiconductor device by using the above-described substrate processing apparatus. Here, a description will be made of, as an example, a process of forming an aluminum oxide film on the silicon substrate. For the film-forming method, ALD is used, which alternately supplies gas containing the metal material and gas containing oxygen or nitrogen, thereby forming the film. Moreover, TMA which is liquid at room temperature is used for the metal material, and water is used for the gas containing the oxygen or the nitrogen.

In the substrate processing, first, the susceptor 3 is dropped to the standby position, and the gate valve 7 is then opened. By the transfer robot 38, one silicon substrate 8 is carried into the processing chamber 1 through the substrate delivery port 30, and is transferred onto the susceptor 3, followed by holding. After closing the gate valve 7, the susceptor 3 is elevated to the predetermined film-forming position by the elevator mechanism 56. The susceptor 3 is heated up while controlling the heater 55 by temperature controlling means 14, and the silicon substrate 8 is thus heated for a fixed time. The inside of the processing chamber 1 is evacuated by the vacuum pump 37, and the inside of the processing chamber 1 is controlled at a predetermined pressure by the pressure controlling means 15. After the substrate is heated up to a predetermined temperature, and the pressure is stabilized, the film forming on the substrate is started. The film-forming is composed of the following four steps, and is repeated for plural cycles until a film with a desired thickness is formed while taking the four steps as one cycle.

In Step 1, the valve 9 is opened, and the liquid material TMA of which flow rate is controlled by the liquid flow rate controlling means 22 is supplied to the evaporating means 23, and the TMA gas as the first reaction gas evaporated by the evaporating means 23 is supplied from the TMA supply line 4 through the supply port 19 into the processing chamber 1. When the TMA gas is diluted, the valve 12 is further opened, and Ar gas of which flow rate is controlled by the flow rate controlling means 21 is flown from the Ar supply line 17 to the TMA supply line 4. Then, TMA gas mixed with the Ar gas is supplied from the TMA supply line 4 through the supply port 19 into the processing chamber 1. The TMA gas is supplied onto the silicon substrate 8, and is adsorbed on the surface thereof. Excessive gas is discharged from the outlets 11 provided on the outer circumference of the plate 2 to the space 33 below the plate 2, is flown in the space 33 in the direction of the arrows in the drawing, and is exhausted from the exhaust port 16.

In Step 2, the supply of the TMA gas from the evaporating means 23 is stopped while keeping the valve 9 open. When the valve 12 is closed in this case, the valve 12 is opened. The Ar gas of which flow rate is controlled by the flow rate controlling means 21 is flown from the Ar supply line 17 to the TMA supply line 4, is supplied through the supply port 19 into the processing chamber 1. Then, the TMA gas remaining in the TMA supply line 4 and the processing chamber 1 is substituted by the Ar gas, and is exhausted from the exhaust port 16.

In Step 3, both of the valves 9 and 12 are closed, and the valve 10 is opened instead. Then, the water of which flow rate is controlled by the liquid flow rate controlling means 24 is supplied to the evaporating means 25, and the water vapor evaporated by the evaporating means 25 is supplied from the water supply line 5 through the supply port 20 into the processing chamber 1. Alternatively, the valve 13 is opened, the carrier gas Ar of which flow rate is controlled by the flow rate controlling means 21 is flown from the Ar supply line 17 to the water supply line 5, and the water vapor is thus mixed with the Ar gas. Then, the water vapor mixed with the Ar gas is supplied from the water supply line 5 through the supply port 20 into the processing chamber 1. On the silicon substrate 8, the TMA adsorbed in Step 1 and the water vapor react with each other, and the aluminum oxide film is formed. Excessive gas is discharged from the outlets 11 provided on the outer circumference of the plate 2 to the space 33 below the plate 2, is flown in the space 33 in the direction of the arrows in the drawing, and is exhausted from the exhaust port 16.

In step 4, the supply of the water vapor from the evaporating means 25 is stopped while keeping the valve 10 open. When the valve 13 is closed in this case, the valve 13 is opened. The Ar gas of which flow rate is controlled by the flow rate controlling means 21 is flown from the Ar supply line 17 to the water supply line 5, is supplied through the supply port 20 into the processing chamber 1. Then, the water vapor remaining in the water supply line 5 and the processing chamber 1 is substituted by the Ar gas, and is exhausted from the exhaust port 16.

In order to enhance the throughput, it is desirable that a time required for the above-described Steps 1 to 4 be one second or less in each thereof. These four steps taken as one cycle are repeated plural times, and the aluminum oxide film having a desired film thickness is thus formed on the substrate 8. After the film forming is ended, the susceptor 3 descends to the standby position by the elevator mechanism 56. The silicon substrate 8 that has been subjected to the film-forming processing is carried outside of the processing chamber 1 through the gate valve 7 by the transfer robot 38.

As ranges of conditions for the above-described processing, it is preferable that a substrate temperature be 100 to 500° C., that a pressure in the processing chamber be 13.3 to 133 Pa (0.1 to 1 Torr), that a total flow rate of the carrier gas and the reaction gas be 0.1 to 2 slm, and that the film thickness be 1 to 50 nm.

Note that the substrate temperature and the pressure in the processing chamber in each step are controlled by the temperature controlling means 14 and the pressure controlling means 15. Moreover, the temperature controlling means 14, the pressure controlling means 15, the respective valves 9, 10, 12 and 13, the evaporating means 23 and 25, and the flow rate controlling means 21, 22 and 24 are integrally controlled by controlling means 40.

A description will be made below of functions of the above-described embodiment.

In Steps 1 to 4, the gases supplied from the gas supply ports 19 and 20 flow in the space 34 above the plate 2. A part of the gases which have flown is discharged to the space 33 below the plate 2 from the outlet 11a upstream of the substrate 8 and an outlet 11C midstream thereof (hereinafter, simply referred to as the upstream outlet 11A and the like), flows below the susceptor 3 toward the exhaust port 16, and is exhausted from the exhaust port 16. The rest of the gases flows from the side of the substrate 8 onto the substrate 8 along the plate 2 in the single direction, and flows toward the midstream outlet 11C and the outlet 11B downstream of the substrate 8 (hereinafter, simply referred to as the downstream outlet 11B and the like). Then, the rest of the gases is discharged from the downstream outlet 11B and the like to the space 33 below the plate 2, and is exhausted form the exhaust port 16. As described above, the gases are discharged while being supplied to the spaces 34 and 33 in the processing chamber 1, and the thin film is thus formed on the substrate 8.

In Steps 1 and 3, the outlets 11A, 11B and the like are composed so that the conductance of the upstream outlet 11A and the like can become larger than that of the downstream outlet 11B and the like, and accordingly, a film good in uniformity of the film thickness can be formed on the substrate.

Specifically, a flow passage resistance of the gas discharged to the space 33 below the plate 2 through the upstream outlet 11A becomes smaller than a flow passage resistance of the gas discharged thereto through the downstream outlet 11B. Hence, it becomes easier for the gas from the upstream outlet 11A to be discharged to the space 33 below the plate 2 than for the gas from the downstream outlet 11B, and a large amount of the gas is discharged from the upstream outlet 11A. As a result, it is relieved that the pressure rises on the upstream side and that the pressure drops on the downstream side, and the pressure distributions of the TMA gas and the water vapor, which are supplied onto the substrate 8, become uniform. The TMA gas and the water vapor are adsorbed onto the substrate 8 located under the pressure distributions thus made uniform.

With regard to such adsorption, from experimental and theoretical considerations, it is understood that, when the temperature is constant, an adsorption amount of gas molecules on a certain surface is represented by a vapor phase pressure. Hence, in Steps 1 and 3, the pressure distributions on the substrate are made uniform, and accordingly, the adsorption amounts of the gases onto the substrate are made uniform, and the film good in uniformity of the film thickness can be formed on the substrate. Moreover, yield of the semiconductor device can be enhanced.

Meanwhile, in Steps 2 and 4, the outlets 11A, 11B and the like are composed so that the conductance of the upstream outlet 11A and the like can become larger than that of the downstream outlet 11B and the like, and accordingly, rapid exhaust can be performed, and the purging efficiency can be enhanced.

Specifically, when the purge gas is supplied from the gas supply ports 19 and 20 into the processing chamber 1 in the case of purging the inside of the processing chamber 1, a larger amount of the purge gas than that of the purge gas from the downstream outlet 11B and the like is discharged from the upstream outlet 11A and the like to the space 33 below the plate 2, and flows toward the exhaust port 16. Hence, the purge gas is rapidly distributed to the entire space 33 below the plate 2, and accordingly, the purging efficiency is enhanced significantly. As a result, in Steps 1 and 3, by-products and the residual gases, such as the TMA gas and the water vapor, which reside in the space 33 below the plate 2 and are adsorbed to the processing chamber inner wall 32 as the inner wall of the space 33, can be removed efficiently. As described above, the residual gases and the by-products, which are generated in Steps 1 and 3, can be exhausted from the processing chamber 1 efficiently in a short time, and accordingly, the throughput can be enhanced.

In particular, the above-described effects of making the pressure distributions uniform are exerted effectively when the thin film is formed on the substrate 8 by the ALD which flows the gases to the substrate 8 in the single direction. This is because a pressure difference which necessarily occurs in the case of increasing the flow rates of the reaction gases supplied to the substrate 8 can be cancelled.

Moreover, the upstream outlet 11A is provided on the side which is downstream of the supply ports 19 and 20 and upstream of the substrate 8. Accordingly, a larger amount of the purge gas can be smoothly discharged from the outlet 11A to the entire space 33 below the plate 2, and the purging efficiency is enhanced.

Furthermore, since the supply ports are provided on the outside of the plate, the gases discharged from the upstream outlet 11A to the space 33 below the plate 2 can be flown thereinto from the most upstream side of the space 33. Accordingly, the purging efficiency can be enhanced more.

Moreover, the apparatus of this embodiment supplies the gases from the side of the substrate 8 to the substrate 8 without using a shower plate, and exhausts the gases from the opposite side to the supply side. In addition, the apparatus provides the outlet 11A of which conductance is made larger than that of the downstream outlet 11B on the side which is downstream of the gas supply ports 19 and 20 and upstream of the substrate 8, and exhausts the gases from the opposite side to the gas supply side while sandwiching the substrate therebetween. Accordingly, in comparison with a conventional apparatus which supplies the gases in a shower form to the substrate from the shower plate provided above the substrate, the gas pressures on the upstream side of the gas supply ports do not rise, and the residual gases can be exhausted rapidly. Furthermore, in the one-side flow, particles can be prevented from running back and being dispersed from the exhaust port, and the pressure distributions on the wafer can be made uniform.

Moreover, according to this embodiment, the outlets 11 are composed of the gap G formed between the plate 2 and the processing chamber inner wall 32. Accordingly, the position of the plate 2 is shifted so that an upstream gap $G_u$ can be large and that a downstream gap $G_d$ can be small, thus making it possible to easily provide the outlets 11 in which the conductance of the upstream side is larger than that of the downstream side. Thus, the pressure distributions on the substrate can be made uniform and the residual gases in the space 33 below the plate 2 can be removed efficiently.

Note that, though the description has been made of the ALD in this embodiment, it is needless to say that the present invention can also be utilized for MOCVD to which a cyclic method is applied and for usual MOCVD which simultaneously supplies two or more types of gases to deposit the film.

Next, there will be analyzed an influence given from the plate shape and the shifting of the plate to making the pressure distributions on the substrate uniform, and it will be verified that the pressure distributions on the substrate are made more uniform in such a manner as described above that the outlets are composed so that the conductance of the upstream outlet can become larger than that of the downstream outlet.

Figure 3:
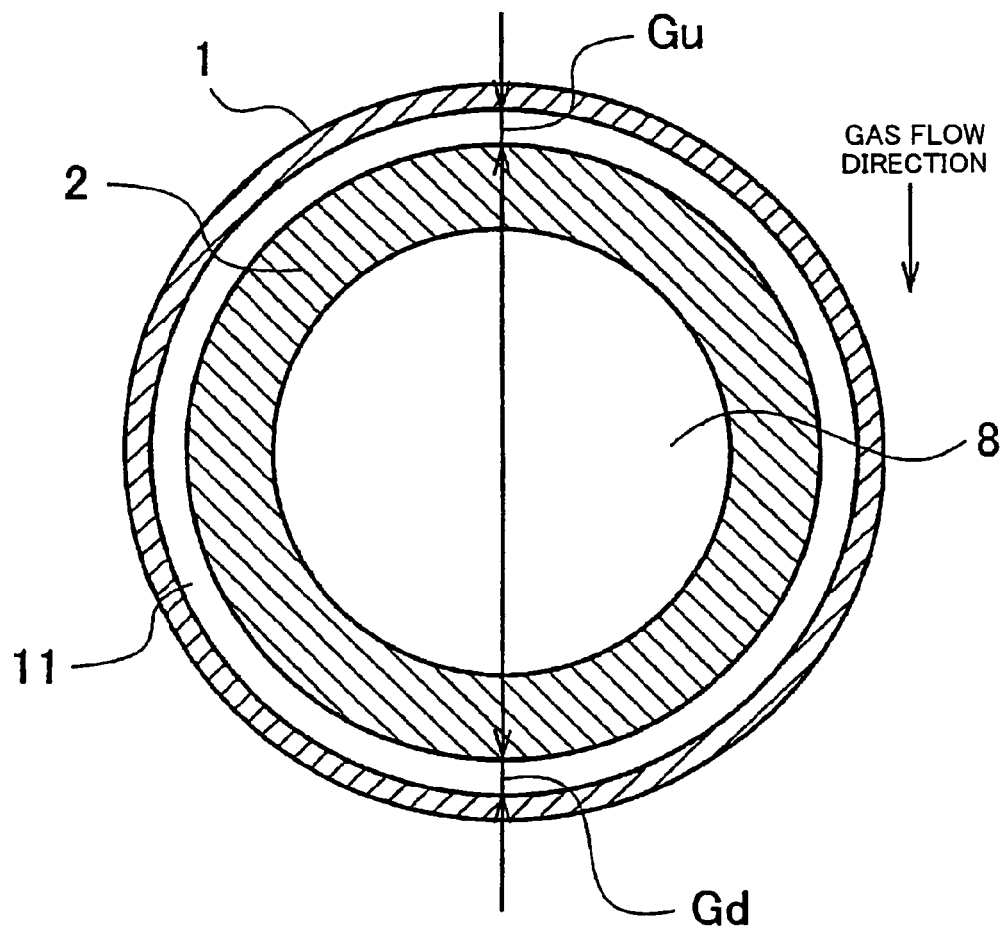
FIG. 3 is a plan view showing a shape of a conductance plate according to the embodiment.
Figure 4:
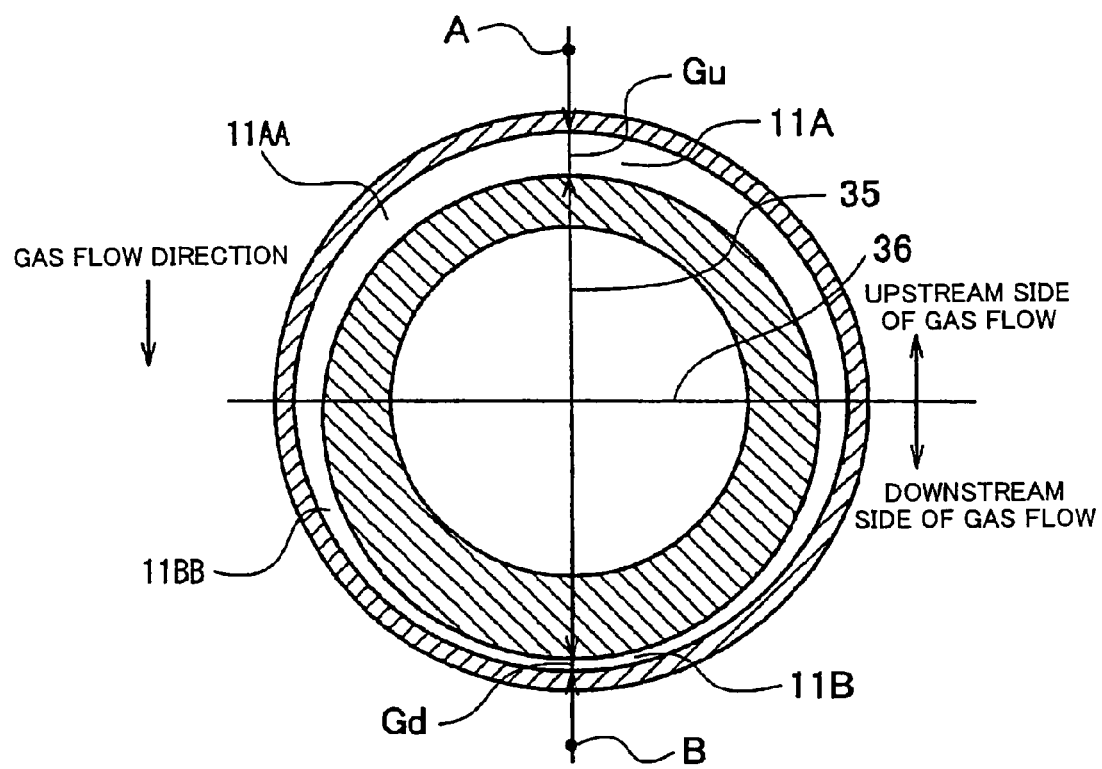
FIG. 4 is a plan view showing the shape of the conductance plate according to the embodiment.

A description will be made of a method of analysis for the pressure distributions on the substrate, which was performed by the inventors of the present invention, with reference to FIG. 3 to FIG. 6. FIGS. 3 and 4 are views showing shapes of conductance plates for use in this analysis. In the conductance plate shown in FIG. 3, an upstream gap and a downstream gap, which will be described later, become equal in interval to each other. In the conductance plate shown in FIG. 4, the upstream gap becomes wide, and the downstream gap becomes narrow.

Figure 5:
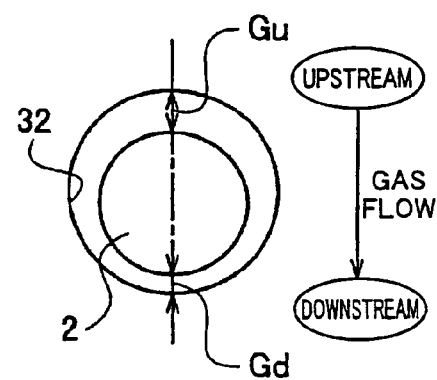
FIG. 5 is an explanatory view of shapes of four types of conductance plates for use in analyzing pressure distributions on a substrate.

With regard to shapes of conductance plates of four types of samples shown in FIG. 5, the pressure distributions on each substrate were obtained by using three-dimensional thermal fluid analysis software made by Fluent Inc. The shapes No. 1 to No. 4 of the four types of conductance plates are the ones in which the gap (hereinafter, simply referred to as an upstream gap) $G_u$ of the upstream outlet 11A is changed so as to become as large as 5 mm, 6 mm, 7 mm, and 8 mm, and on the contrary, the gap (hereinafter, simply referred to as a downstream gap) $G_d$ of the downstream outlet 11B is changed so as to become as small as 5 mm, 4 mm, 3 mm, and 2 mm. In the case of the shape No. 1, as shown in FIG. 3, both of the upstream gap $G_u$ and the downstream gap $G_d$ become equal in interval to each other, which are 5 mm. In the case of the shapes No. 2 to No. 4, as shown in FIG. 4, the upstream gaps $G_u$ become wide, and the downstream gaps $_d$ become narrow.

As conditions of the analysis, the substrate diameter was set at 300 mm, the substrate temperature was set at 300° C., the pressure in the processing chamber was set at 13 Pa, the flow rate of the Ar gas was set at 1 slm, the mole fraction of the water vapor was set at 0.027, the temperature of the processing chamber inner wall was set at 100° C., and the temperature of the conductance plate was set at 150° C.

Figure 6:
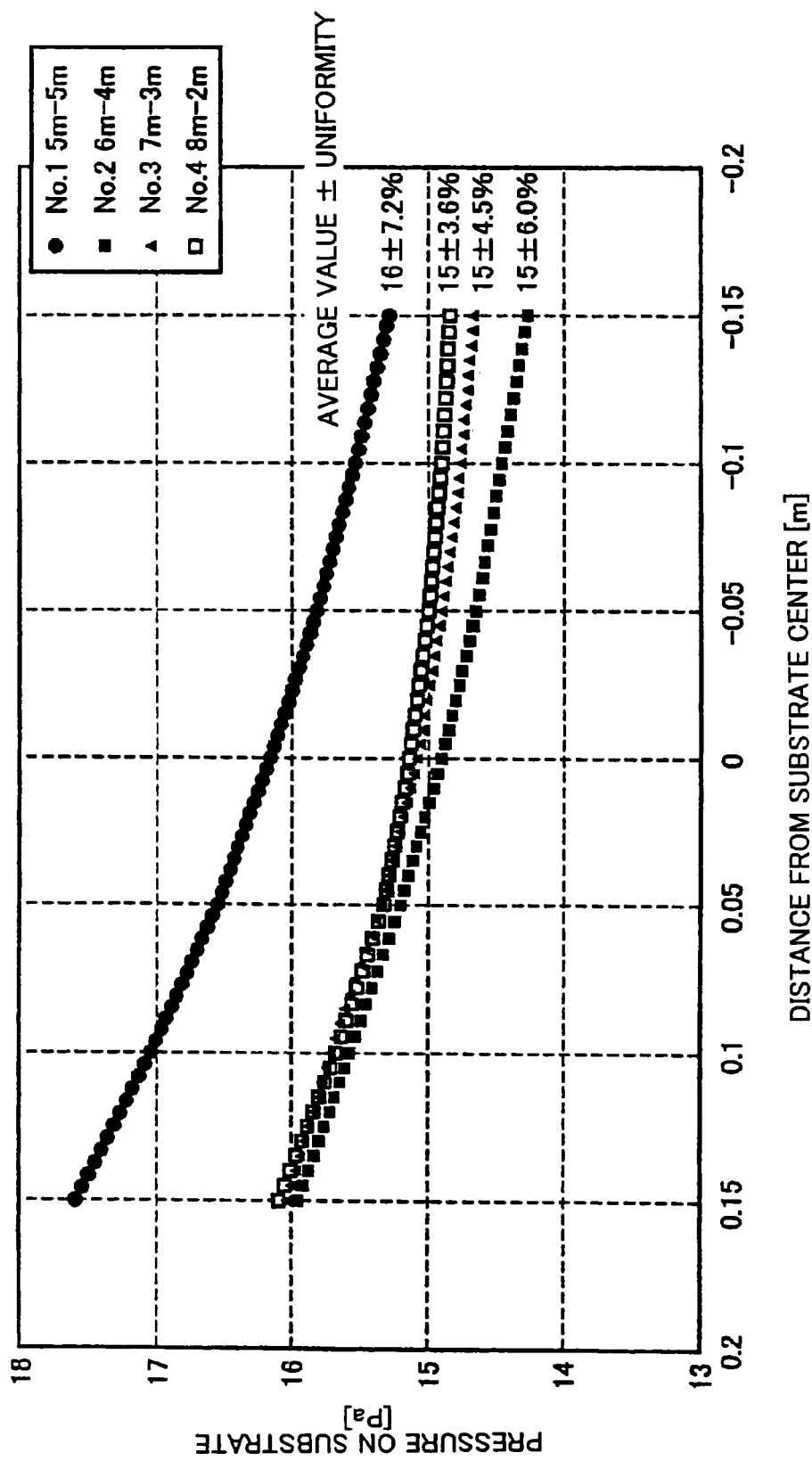
FIG. 6 is a characteristic chart showing the pressure distributions depending on the shapes of the plates and obtained by the analysis on the substrate.

FIG. 6 is a view showing the pressure distributions on the substrate, which were obtained by this analysis. The pressure distributions on the substrate can be represented by pressure values on a solid line shown in FIG. 3. From FIG. 6, it is understood that, in all the samples, the pressures tend to be high on the upstream side and to drop toward the downstream side, that the uniformity of the pressure on the substrate is enhanced as widening the upstream gap $G_u$ and narrowing the downstream gap $G_d$, and that the sample shape No. 4 has the best uniformity of the pressure. Specifically, the gap between the conductance plate and the processing chamber inner wall, that is, the opening area of the outlets is changed to increase the amount of gas flowing on the upstream side, thus making it possible to relieve the tendency that the pressure on the upstream side of the gas flow rises.

The above can be reworded in the following manner when attention is paid to the conductance of the flow. In FIG. 4, a straight line 36 which is perpendicular to a straight line 35 connecting a center A of the gas supply ports and a center B of the exhaust port to each other in a surface parallel to the surface of the substrate 8 and passes through the center of the substrate 8 is defined as a boundary. Here, the gas supply ports side of the boundary is defined as an upstream side of the gas flow, and the exhaust port side of the boundary is defined as a downstream side of the gas flow. In this case, conductance of a space flowing in an outlet 11AA on the upstream side of the boundary in the gas flow is made larger than that in an outlet 11BB on the downstream side of the boundary in the gas flow, thus making it possible to enhance the pressure distributions in the substrate surface.

The outlets 11 just need to be individually provided anywhere in an upstream region of the above-described boundary and anywhere in a downstream region of the boundary. Even if the outlets 11 are only provided at least on the upstream side and downstream side of the substrate 8 on the plate 2, the pressure distributions in the substrate surface can be made uniform.

With regard to a value of the conductance of the outlets 11, when a height of the plate 2 onto which the gas flows is the same between the upstream side and the downstream side, the conductance becomes larger as an area (opening area) of the gap is larger. Hence, the opening area of the upstream outlet is made larger than that of the downstream outlet, thus making it possible to compose the outlets 11 so that the conductance of the upstream outlet 11 can become larger than that of the downstream outlet 11.

From results of the analysis, it was able to be verified that the uniformity of partial pressure distributions on the substrate is enhanced by shifting the position of the plate 2 to the exhaust side, thereby composing the outlets so that the conductance of the upstream outlet can become larger than the conductance of the downstream outlet.

Figure 7:
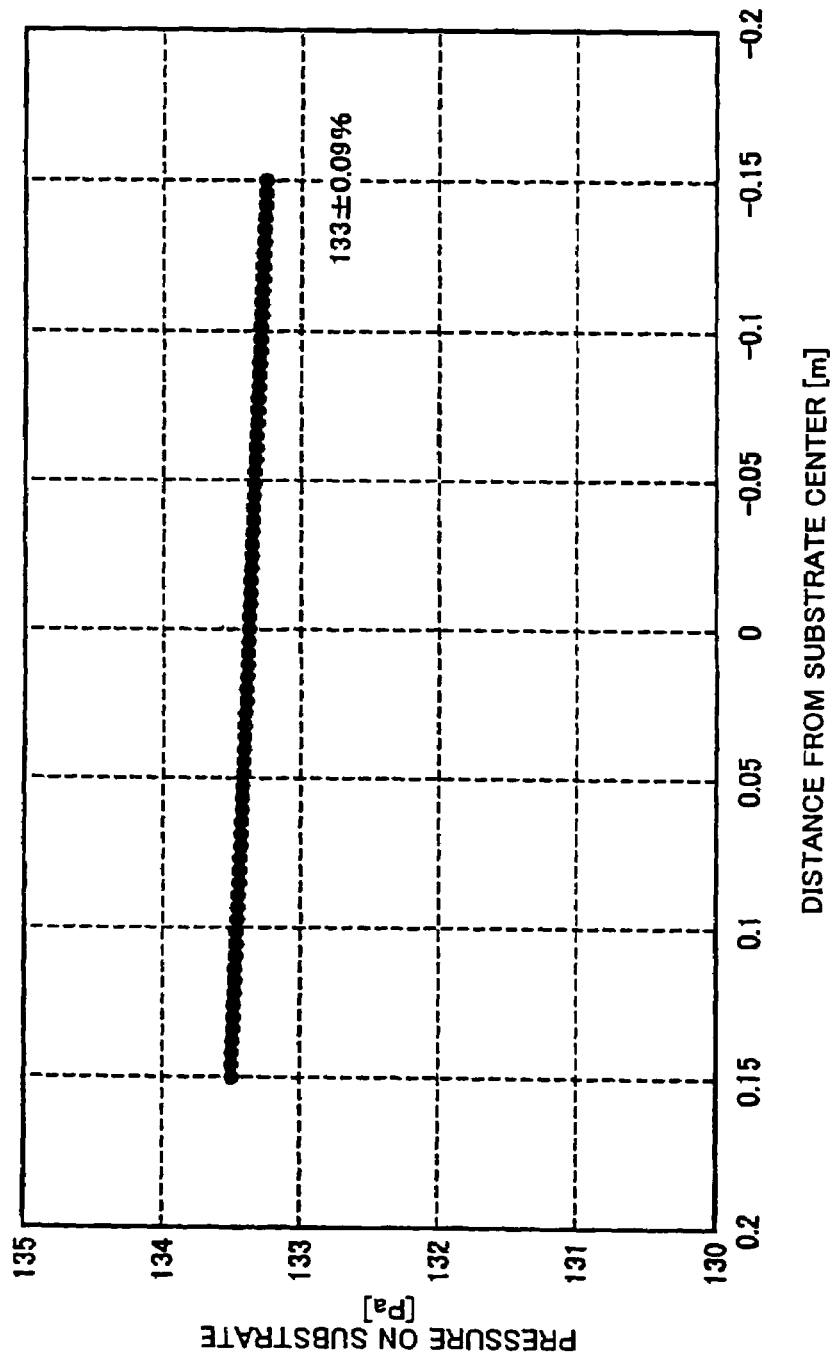
FIG. 7 is a characteristic chart showing a pressure distribution when only an exhaust pressure is changed to 133 Pa in a sample shape No. 1.

Incidentally, FIG. 7 is a view showing a pressure distribution on the substrate when only the pressure in the processing chamber among the above-described conditions for the analysis was changed from 13 Pa to 133 Pa in the sample shape No. 1 in which the upstream conductance and the downstream conductance are equal to each other. As understood from this drawing, when the pressure is as high as 133 Pa, the pressure uniformity becomes good even if the upstream conductance and the downstream conductance are equalized to each other. From this fact, it can be said that the present invention which increases the upstream conductance more than the downstream conductance is effective means particularly at the pressure in the processing chamber, which is approximately 10 Pa or less, as in the case of FIG. 6 where the pressure distributions on the substrate were obtained.

Moreover, in the case where the exhaust pressure was set at 13 Pa in the sample shape No. 1, if the conductance of the outlets 11 was made the smallest as possible, that is, if the gap G formed between the plate 2 and the pressure chamber inner wall 32 is made the smallest as possible, then the pressure on the substrate rises, and as in the case where the exhaust pressure is 133 Pa, an improvement effect of the pressure distribution characteristics on the substrate can be expected sufficiently. However, in this case, it takes longer to exhaust the residual gases and the by-products in Steps 2 and 4, leading to reduction of the throughput, and accordingly, it cannot be said that this is effective means.

Note that, in the above-described embodiment, the outlets are adapted to be formed between the plate and the processing chamber inner wall; however, without being limited to this, the outlets may be formed in the plate itself for example. Moreover, the magnitude of the conductance of the outlets is adapted to be changed by changing the area (opening area) of the gap; however, without being limited to this, the magnitude may be adapted to be changed by changing a length of each flow passage of the outlets for example. Furthermore, each of the outlets formed individually on the upstream side and the downstream side is composed of one outlet with respect to the gas flow; however, without being limited to this, may be composed of a plurality of outlets with respect to the gas flow for example. A description will be individually made below of modification examples of these.

Figure 8:
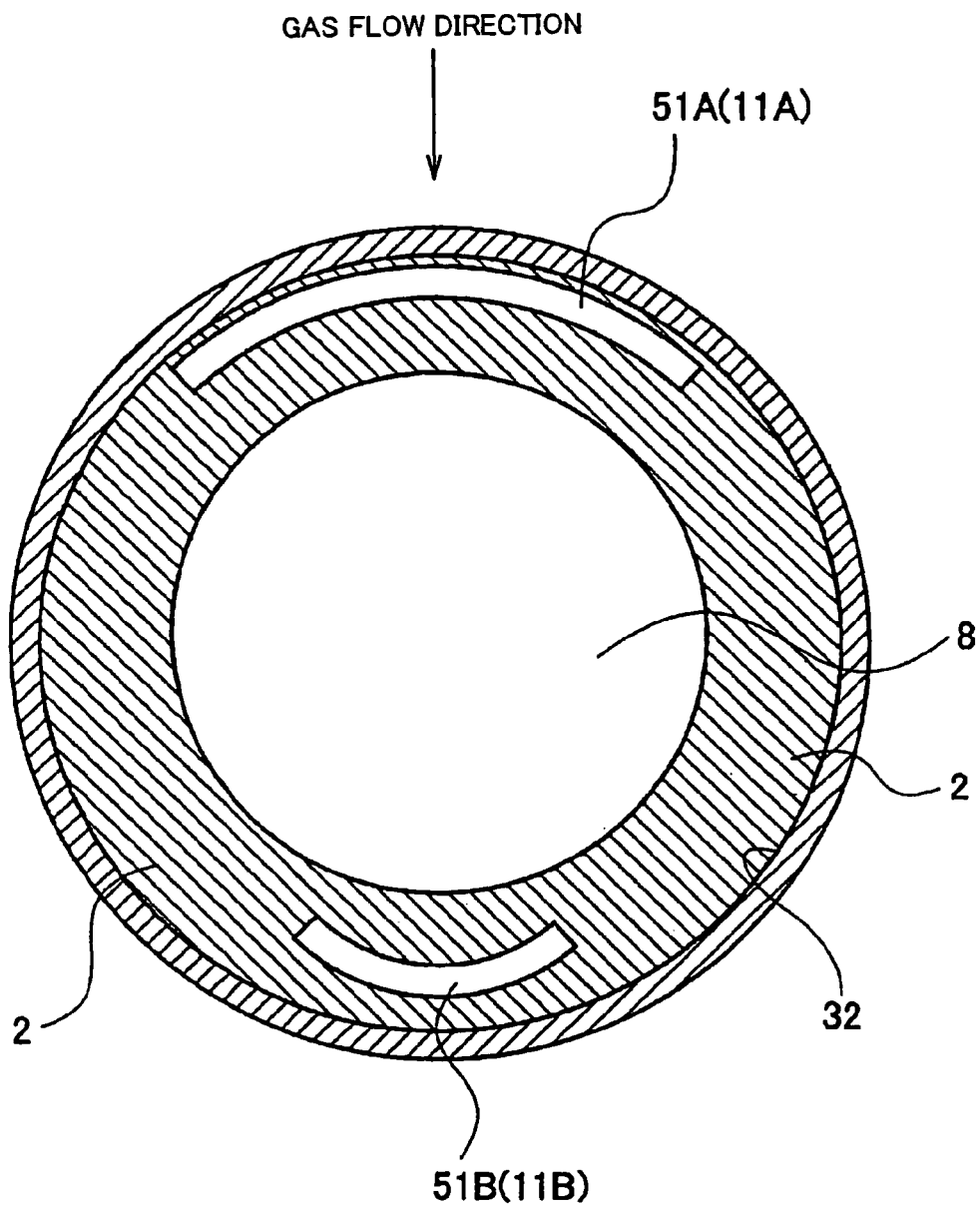
FIG. 8 is a plan view showing a shape of a conductance plate according to a modification example of the embodiment.

FIG. 8 is a view showing an example of the embodiment where the outlets are provided in the plate itself. The space 33 (refer to FIG. 1) below the plate 2 is closed by the plate 2 in such a manner that an outer diameter of the plate 2 is matched with an inner diameter of the processing chamber inner wall 32. On the upstream side and downstream side of the substrate 8 on the plate 2, openings 51A and 51B are provided, respectively, which are then defined as the upstream and downstream outlets 11A and 11B. The openings 51 (51A and 51B) are provided, for example, to have arc shapes so as to go along with the annular shape of the plate, an opening area of the upstream arc is made larger than an opening area of the downstream arc, and the outlets 11 are thus composed so that the conductance of the upstream outlet can be larger than the conductance of the downstream outlet. As in the illustrated example, each of the openings 51 may be formed so as to be closed in a manner of being fit in the plate surface; however, the opening may be formed so as to be open by notching the outer circumferential portion of the plate.

This embodiment has a construction in which the upstream and downstream outlets 11 of the conductance plate 2 are not continuous with each other. However, the conductance of the opening 51A on the upstream side of the gas flow is made larger than that of the opening 51B on the downstream side of the gas flow, thus making it possible to efficiently remove the residual gases while enhancing the pressure distributions on the substrate 8.

Figure 9A:
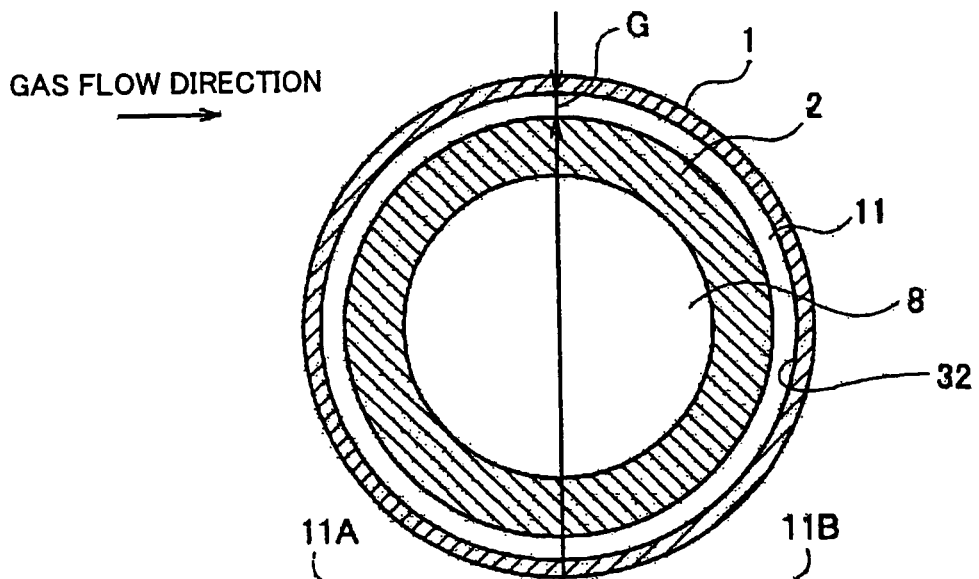
FIG. 9(a) is a plan view.
Figure 9B:
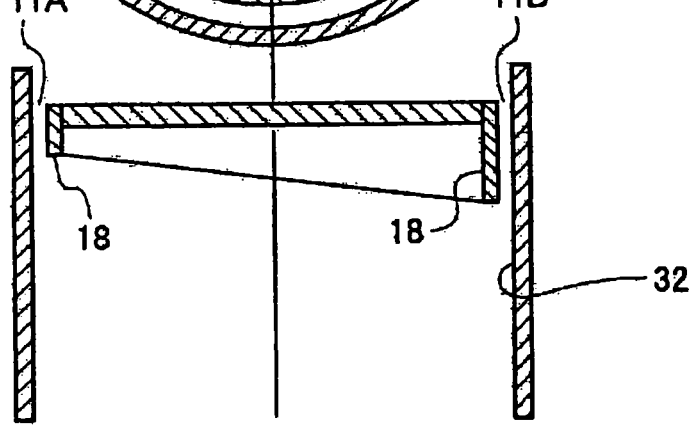
FIG. 9(b) is a longitudinal cross-sectional view.
Figure 9C:
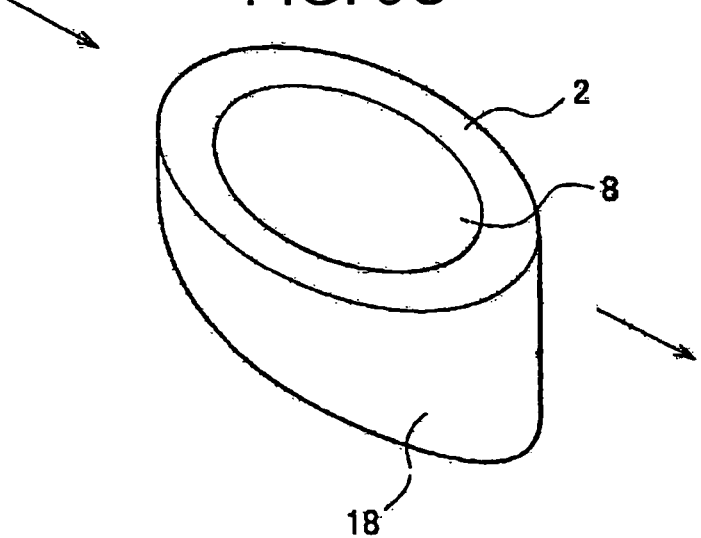
FIG. 9(c) is a perspective view.

Moreover, FIG. 9 shows the one adapted to change the magnitude of the conductance of the outlets 11 by changing the length of each flow passage of the outlets 11.

A skirt (side plate) 18 longer than the thickness of the plate 2 is suspended from the outer circumference of the plate, and the skirt 18 is composed so as to gradually lengthen a height of the skirt 18 concerned from the upstream side to the downstream side (FIG. 9(*c*)). Although the gap G formed between the plate 2 and the processing chamber inner wall 32 is equal in interval over the entire circumference of the plate 2 (FIG. 9(*a*)), the skirt 18 of the conductance plate 2 is composed so that the length of the skirt 18 concerned can become shorter on the upstream side and longer on the downstream side (FIGS. 9(*b*) and 9(*c*)).

The conductance becomes larger in the gas flow passage of the outlet 11, of which length is shorter, and accordingly, the conductance on the upstream side of the gas flow becomes larger than that on the downstream side of the gas flow. Hence, the residual gases can be removed efficiently while enhancing the pressure distributions in the substrate surface.

Note that, since the flow passage is simple in the one in the illustrated example, the length of the upstream flow passage is made shorter than that of the downstream flow passage, and therefore, the outlets can be composed so that the conductance of the upstream outlet can be larger than the conductance of the downstream outlet. In order to compose the outlets in this way even in a case of complicated flow passages, by synthesizing the conductance of the flow passages and judging the conductance thus synthesized, the outlets may be composed so that the synthesized conductance of the upstream outlet can be larger than the synthesized conductance of the downstream outlet.

Figure 10A:
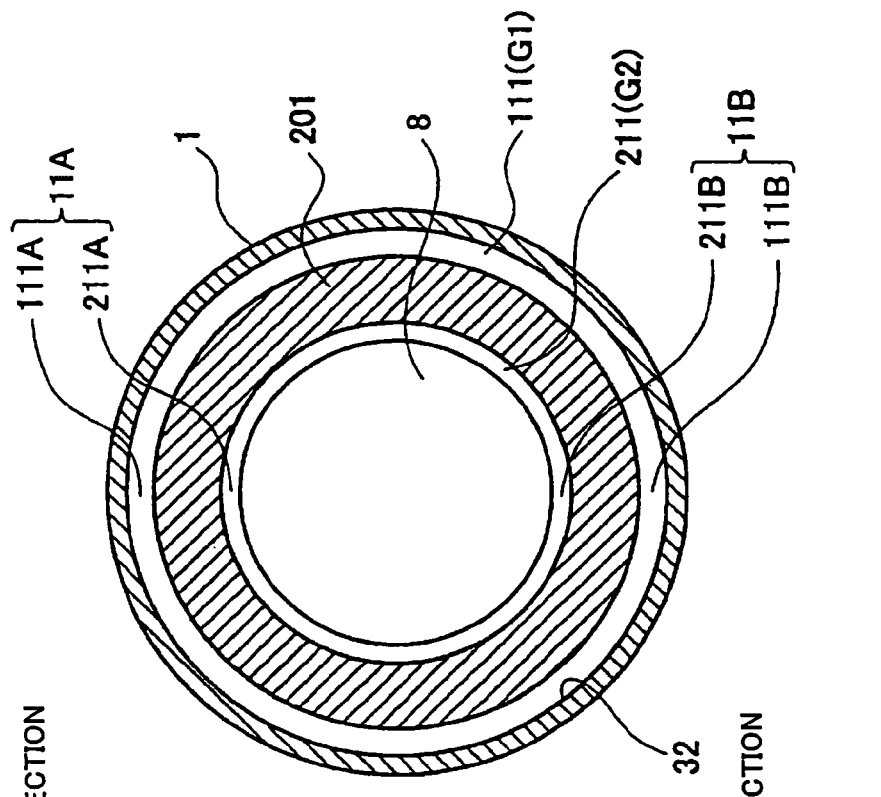
FIG. 10(a) shows a comparative example composed of a single outlet.
Figure 10B:
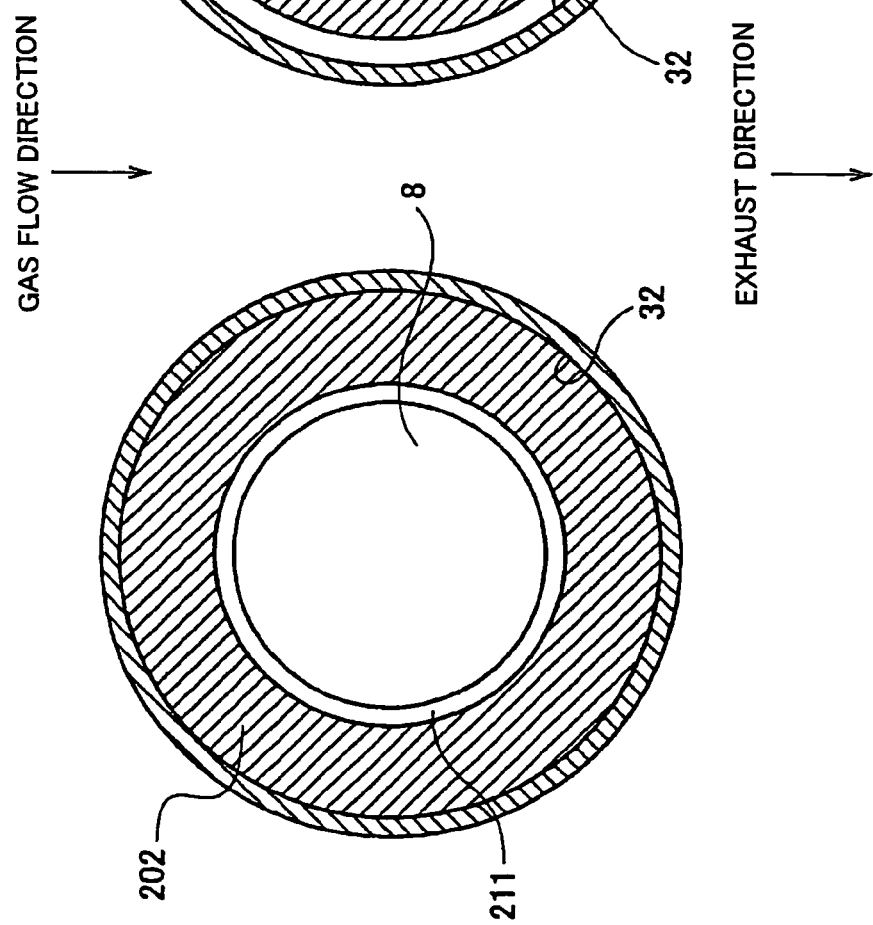
FIG. 10(b) shows the embodiment composed of a plurality of the outlets.

FIG. 10 is plan views of conductance plates showing another embodiment: FIG. 10(b) shows an embodiment in which each of the outlets formed on the upstream side and the downstream side is composed of a plurality of outlets with respect to the gas flow; and FIG. 10(a) shows a comparative example in which each of the outlets is composed of a single outlet with respect to the gas flow. In this embodiment, the outlets are composed so that the conductance of the upstream outlets and the conductance of the downstream outlets are equal to each other.

As shown in FIG. 10(b), in this embodiment, all of the processing chamber inner wall 32, a plate 201, and the substrate 8 are arranged concentrically. Then, the annular plate 201 is formed so that an outer diameter thereof can be smaller than the inner diameter of the processing chamber inner wall 32 and that an inner diameter of the plate 201 can be larger than the outer diameter of the substrate 8, and a first outlet 111 and a second outlet 211 are provided on the outside and inside of the plate 201, respectively. Specifically, an annular gap G1 (outside gap) and an annular gap G2 (inside gap) are provided between the processing chamber inner wall 32 and an outer circumference of the plate 2 and between an inner circumference of the plate 201 and the outer circumference of the substrate 8; respectively. The plate 201 is formed into such a shape, and thus the outlet 11A formed on the upstream side of the gas flow is composed of a first outlet 111A on the upstream side and a second outlet 211A provided on a downstream side thereof. Moreover, the outlet 11B formed on the downstream side is composed of a first outlet 211B on the upstream side and a first outlet 111B provided on a downstream side thereof.

Here, an influence given from the plurality of outlets to the purge will be analyzed, and it will be verified that the plate which has the gaps on both of the inside and the outside has higher purging efficiency. As samples, there were prepared the plate 201 (FIG. 10(b)) which has the gap of 7 mm on the inside and the gap of 2 mm on the inside, and a plate 202 (FIG. 10(a)) which only has the gap of 7 mm on the inside for comparison.

Figure 11:
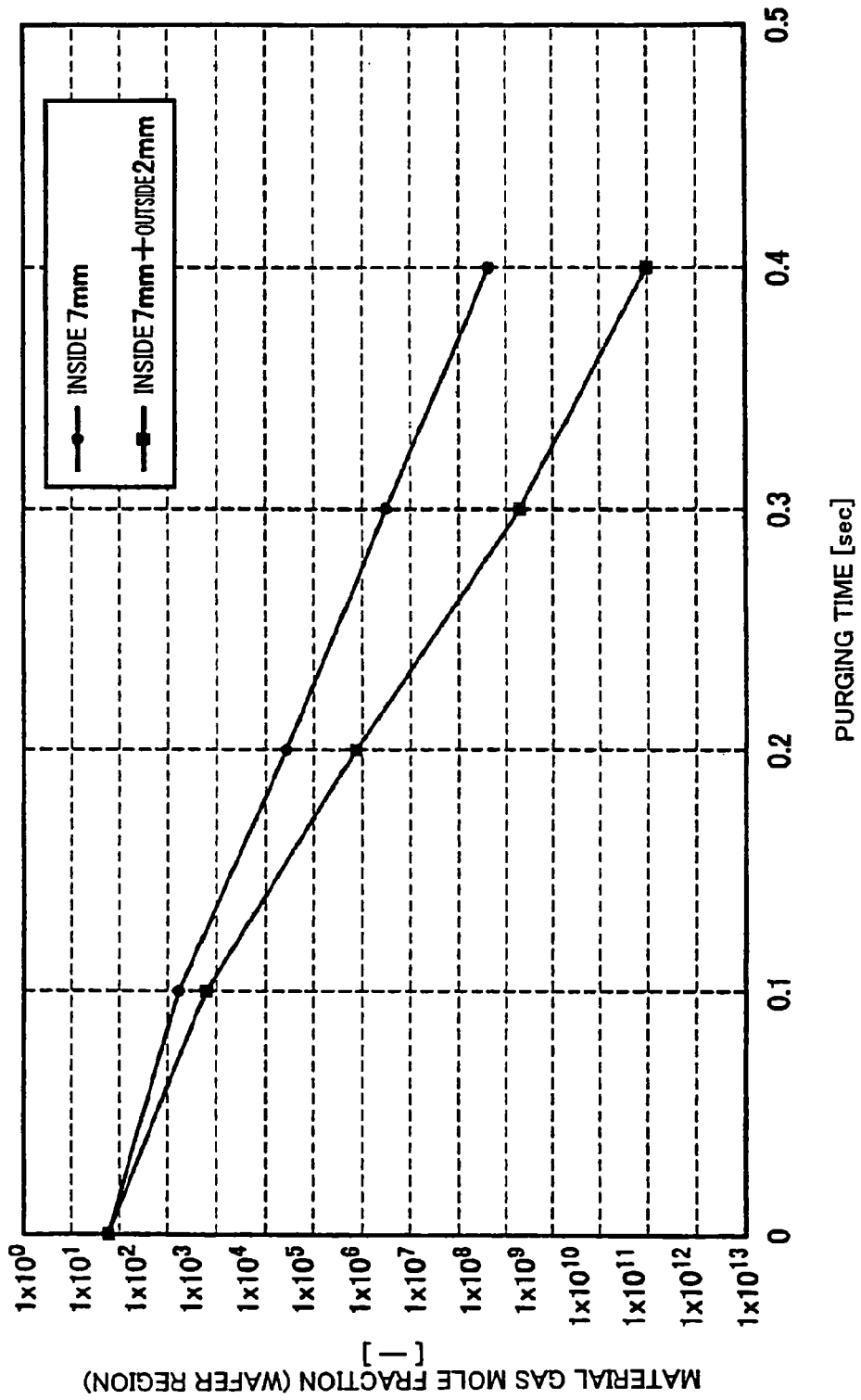
FIG. 11 is a characteristic chart for showing purging time dependencies of material gas mole fractions on the substrate, which are obtained by the analysis.

FIG. 11 is a characteristic chart showing purging time dependencies of the material gas mole fractions on the substrate 8, which were obtained by the analysis. From this, it is understood that, in the plate of FIG. 10(b), which has not only the inner outlets 211 but also the outer outlets 111, the material gas mole fraction is decreased significantly. Specifically, it is conceived that, since the plate 201 has the outlets 111 and 211 on both of the inside and the outside, the effect of the purge is enhanced, and the gas substitution is accelerated. This is because, while the gases in the vicinity of the processing chamber inner wall 32 reside in the case of providing only the inner outlets 211, such residing gases are rapidly exhausted by providing also the outer outlets 111. From such results of the analysis, it was able to be verified that the purging efficiency was enhanced more in the plate which has the gaps on both of the inside and the outside.

Hence, in the case of providing not only the inner outlets 211 but also the outer outlets 111, gas flow ranges in both of the space 34 above the plate 2 and the space 33 below the plate 2 in the processing chamber 1 are widened, and stagnation in the respective spaces 33 and 34 is eliminated. Accordingly, the purging efficiencies of the respective spaces 33 and 34 can be enhanced.

Incidentally, a distribution of gas flow velocities on each plate of the above-described type (FIG. 10(a)) which has the outlets only on the inside and the above-described type (FIG. 10(b)) which has the outlets also on the outside was measured. Then, it was found that each of the types has a portion where the gas flow velocity is decreased (portion where the gas stagnation occurs), and that the gas stagnation occurs on the downstream side of the substrate on the plate. When the gas stagnation occurs, the adsorption amount of the material gas adsorbed to the plate in the vicinity of the gas stagnation and to the processing chamber inner wall is increased, leading to the increase of the purging time, that is, the reduction of the throughput. Moreover, the purge is not performed sufficiently in the portion where the gas stagnation occurs, which will cause the generation of the particles, and reduce the yield.

In this connection, while it is preferable to prevent the gas stagnation on the plate from occurring, it was found that, by further providing outlets at positions corresponding to the portions of the gas stagnation on the plates in both of the types, the gas stagnation on the plates can be solved.

Figure 12:
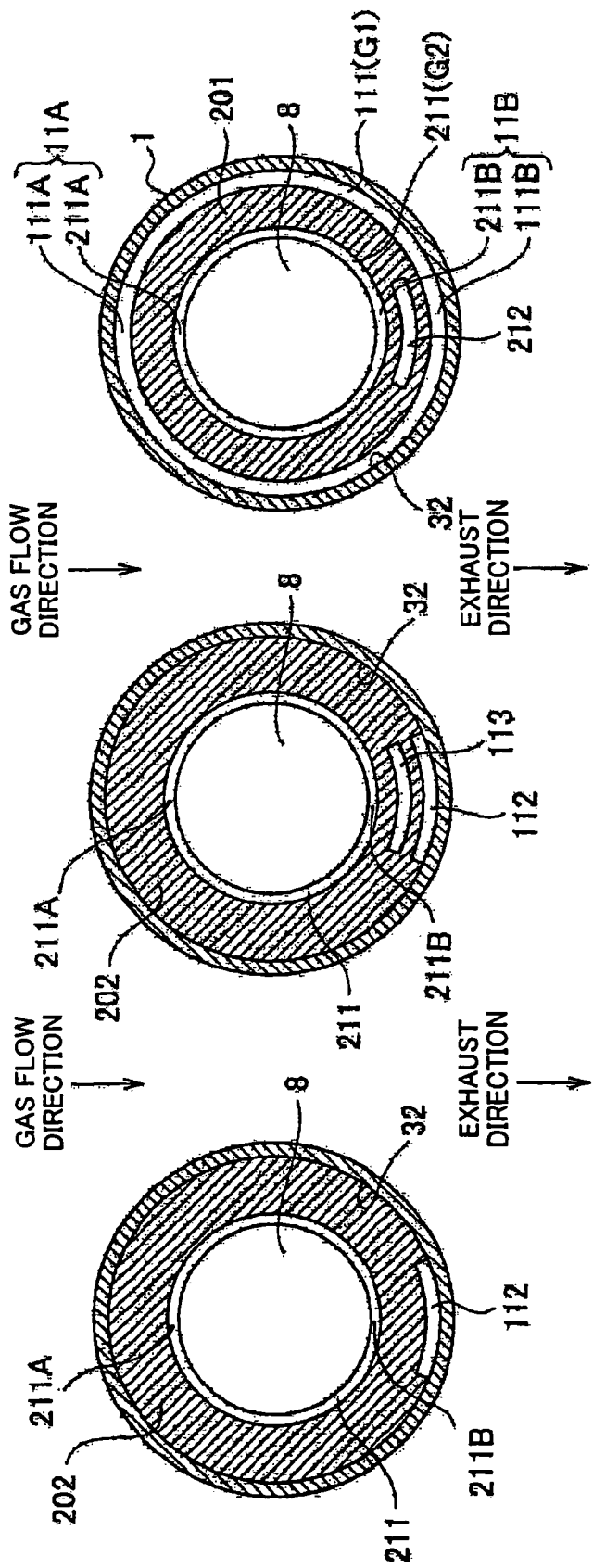
FIG. 12 is plan views of conductance plates according to a modification example of another embodiment.

FIG. 12 is views showing modification examples of the plate in which the outlets for preventing the gas stagnation as described above: FIGS. 12(a) and 12(b) show modification examples of the plate of the above-described type which has the outlets 211 only on the inside; and FIG. 12(c) shows a modification example of the plate of the above-described type which has the outlets 111 also on the outside. The modification example of FIG. 12(a) is the one adapted to provide one outlet 112 for preventing the gas stagnation, and the modification example of FIG. 12(b) is the one adapted to provide a plurality of the outlets for preventing the gas stagnation, and to arrange the plurality of outlets 112 and 113 at an interval in the radial direction of the plate 202, that is, toward the gas flow direction. Positions where these outlets 112 and 113 are provided are set at portions which are on the downstream side of the substrate 8 on the plate 202 and where the gas stagnation occurs between the processing chamber inner wall 32 and the outlets 211. Specifically, in the case of the modification example of FIG. 12(a), one outlet 211A is provided on the upstream side of the substrate 8, two outlets 211B and 112 are provided on the downstream side of the substrate 8, and these outlets are arrayed in this order toward the gas flow direction. Moreover, in the case of the modification example of FIG. 12(b), one outlet 211A is provided on the upstream side of the substrate 8, three outlets 211B, 113 and 112 are provided on the downstream side of the substrate 8, and these outlets are arrayed in this order toward the gas flow direction.

The modification example of FIG. 12(c) is the one adapted to provide one outlet 212 for preventing the gas stagnation, and a position where the outlet 212 is provided is set at a portion which is on the downstream side of the substrate 8 on the plate 201 and where the gas stagnation occurs between the first outlets 111 and the second outlets 211. Specifically, in the case of the modification example of FIG. 12(c), two outlets 111A and 211A are provided on the upstream side of the substrate 8, three outlets 211B, 212 and 111B are provided on the downstream side of the substrate 8, and these outlets are arrayed in this order toward the gas flow direction.

Specifically, in these modification examples, at least two or more, that is, the plurality of outlets are provided at least on the downstream side of the substrate 8 on the plate, and these outlets are arrayed in the single direction toward the gas flow direction. Moreover, the number of outlets on the downstream side of the substrate 8 is adapted to be larger than the number of outlets on the upstream side of the substrate 8. Each shape of these outlets 112, 113 and 212 for preventing the gas stagnation is formed into such a shape as going along with the shapes of the annular plates 202 and 201. Sizes of the arcs, that is, opening areas of the outlets 112, 113 and 212 just need to be sizes to an extent that the gas stagnation can be solved, and each of the outlets is formed so that the opening area thereof can be smaller than the opening area of the outlet 211 or the outlet 111.

As described above, the outlets different from the outlets 211 and the outlets 111 are provided on the portions on the plate, where the gas stagnation occurs, that is, at least two or more outlets are provided at least on the downstream side of the substrate on the plate, and these outlets are arrayed toward the gas flow direction. Thus, the gas flow can be positively formed in the portions where the gas stagnation occurs. Accordingly, the gas stagnation on the plate can be prevented from occurring. Hence, the adsorption amount of the material gas adsorbed to the plate on the portions where the gas stagnation has occurred and to the processing chamber inner wall can be reduced, the purging time can be suppressed from being increased, and the reduction of the throughput can be prevented effectively. Moreover, a sufficient purging effect can be obtained also in the portions where the gas stagnation has occurred, and accordingly, the reduction of the yield, which results from the generation of the particles, can be prevented.

Figure 13:
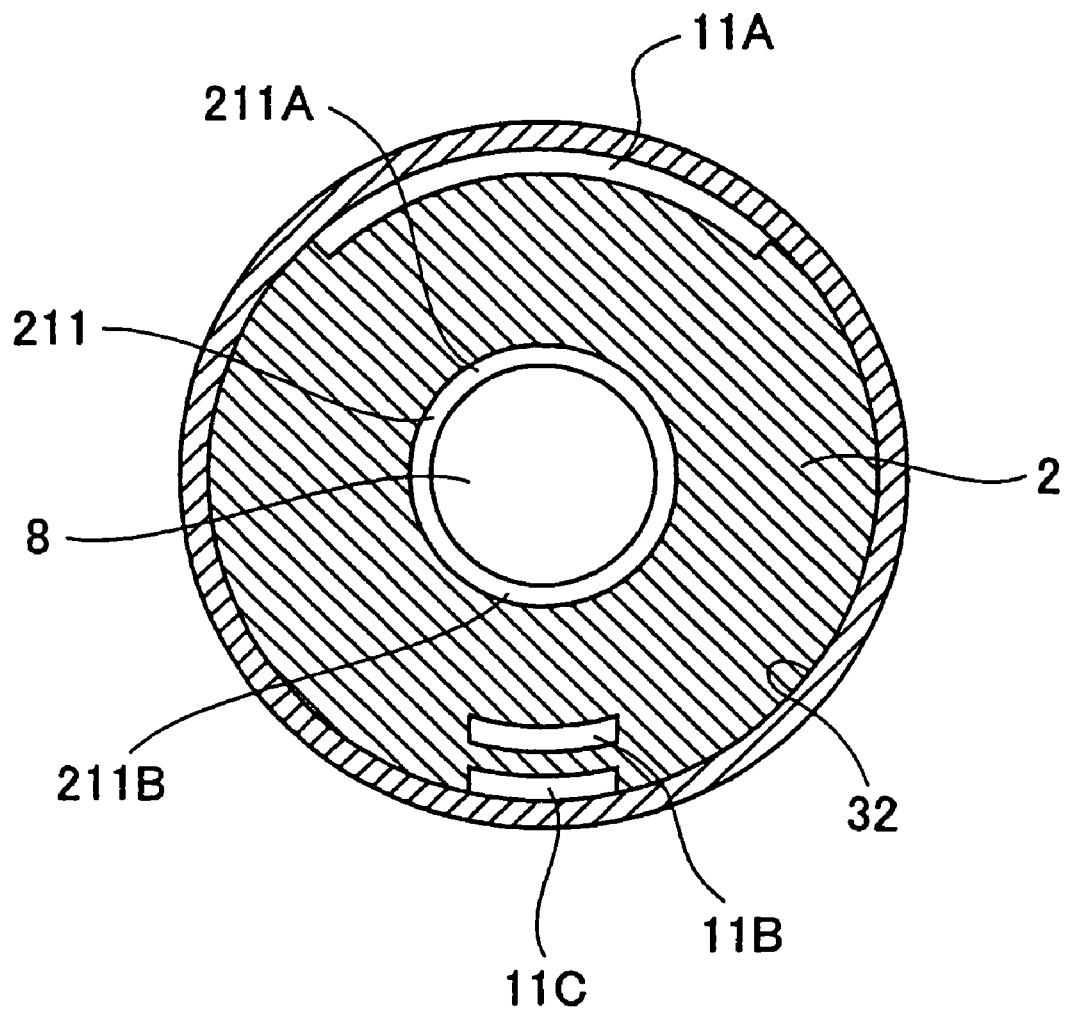
FIG. 13 is a plan view of another conductance plate according to the modification example of the other embodiment.
Figure 14A:
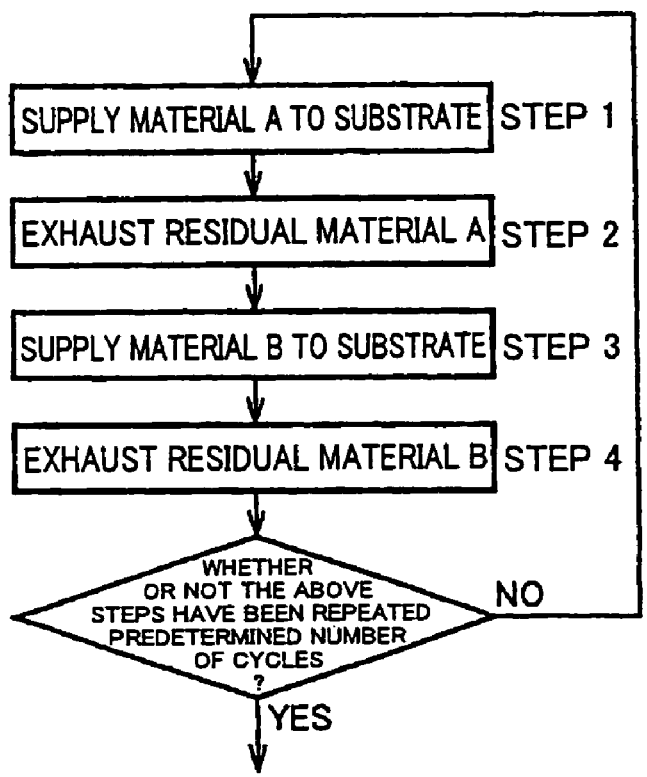
FIG. 14(a) is a flowchart.
Figure 14B:
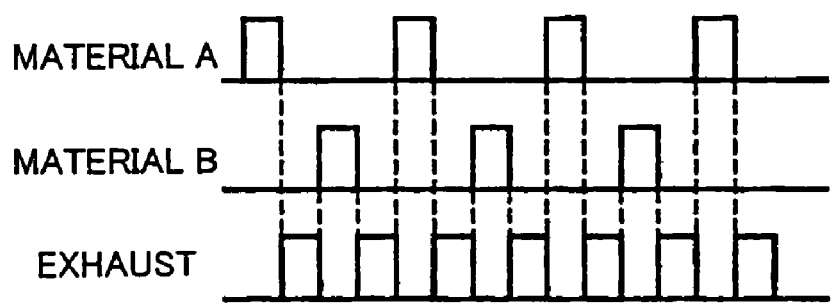
FIG. 14(b) is a timing chart of gas supply.
Figure 15A:
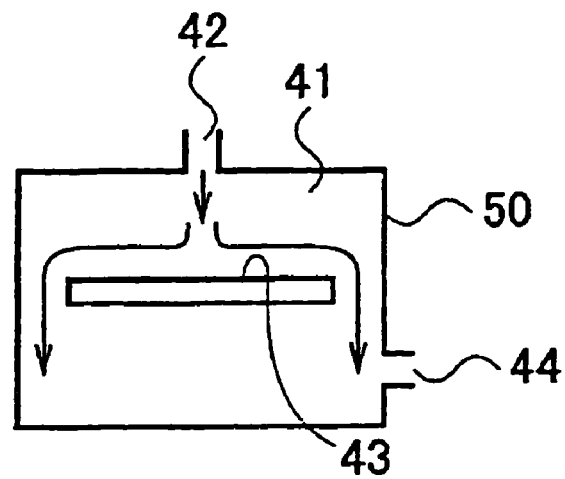
FIG. 15(a) shows a radial flow type.
Figure 15B:
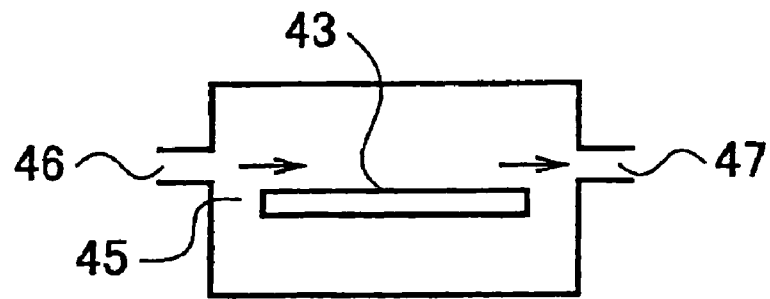
FIG. 15(b) shows a one-side flow type.
Figure 15C:
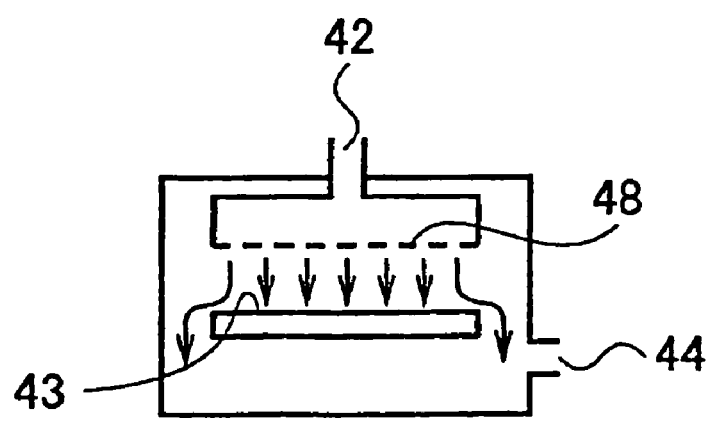
FIG. 15(c) shows an improved example of the radial flow type.

Note that such a concept of preventing the gas stagnation in these modification examples may be applied, for example, to the plate of the type as shown in FIG. 8, and the plate may be formed in to a plate as shown in FIG. 13. In the case of a modification example of FIG. 13, the arc-shaped outlet 11A is provided on the outside of the plate 2, which is the upstream side of the substrate 8, and the arc-shaped outlets 11B and 11C are provided on the outside of the plate 2, which is the downstream side of the substrate 8, and further, the annular outlet 211 is also provided on the inside of the plate 2. Note that the outlets 11B and 11C are formed so that the respective opening areas thereof can be smaller than the opening area of the outlet 11A. Specifically, two outlets 11A and 211A are provided on the upstream side of the substrate 8, three outlets 211B, 11B and 11C are provided on the downstream side of the substrate 8, and these outlets are arrayed in this order toward the gas flow direction. Thus, the conductance of each outlet on the upstream side and the downstream side can be adjusted. Thus, in addition to the effects that the pressure distributions on the substrate can be improved and that the residual gases can be removed efficiently, there are further exerted effects that the gas stagnation can be prevented and that the purging efficiency can be enhanced.

Note that, in the above-described embodiment, the "reaction gas" is a metal-containing material as a first material and a compound and an element as a second material capable of reacting therewith. As a specific metal-containing material (first material), besides the TMA gas containing Al, there is gas containing any metal of Si, Ti, Sr, Y, Zr, Nb, Ru, Sn, Ba, La, Hf, Ta, Ir, Pt, W, Pb, and Bi.

Moreover, the compound and the element (second material) may be gas containing an appropriate nonmetal reactant, that is, gas of water, oxygen, ammonia, or the like, which contains oxygen or nitrogen, in usual. However, in some cases, the second material is radicals and ions, which are activated by a certain method. Moreover, the second material may be the one which, though does not actually react with the metal-containing material, imparts energy to a self-decomposition reaction of the metal-containing material. For example, the second material is noble gas and inert gas, which are activated by plasma. As the gas containing the oxygen or the nitrogen, specifically, besides the illustrated $H_2O$, there are any of $O_2$, $O_3$, NO, $N_2O$, $H_2O_2$, $N_2$, $NH_3$, and $N_2H_6$, and radical species or ion species created by activating any thereof by activating means.

Moreover, the "purge gas" is supplied to the processing chamber 1, and is used in the case of removing unnecessary reactants other than the reactant adsorbed to the substrate 8 and for the purpose of preventing two reaction gases having different groups from being mixed with each other and reacting with each other in a spot other than the inside of the surface of the substrate 8. As the purge gas, besides the illustrated Ar, the other noble gas and inert gas such as nitrogen gas are used.

The invention claimed is:

1. A substrate processing apparatus, comprising:
    a processing chamber which processes a substrate;
    a holding tool which holds the substrate in the processing chamber;
    a plate provided on a periphery of the substrate;
    a supply port which is provided on a side of the substrate to communicate with a space above the plate, and supplies gas to the substrate;
    outlets which are provided at least on an upstream side and downstream side of the substrate on the plate, and discharge the gas to a space below the plate; and
    an exhaust port which is provided on an opposite side to the supply port with the substrate sandwiched therebetween, communicates with the space below the plate, and exhausts the gas in the processing chamber,
    wherein the outlets are composed so that conductance of the upstream outlet can be larger than conductance of the downstream outlet.

2. The substrate processing apparatus according to claim 1, wherein the outlet on the upstream side of the substrate is provided between the supply port and the substrate.

3. The substrate processing apparatus according to claim 1, wherein the supply port is provided on an outside of the plate, the outside being an opposite side to the exhaust port.

4. The substrate processing apparatus according to claim 1, wherein the outlets are composed of openings provided in the plate.

5. The substrate processing apparatus according to claim 1, wherein the outlets are composed of gaps formed between the plate and a wall of the processing chamber.

6. The substrate processing apparatus according to claim 1, wherein an opening area of the upstream outlet is larger than an opening area of the downstream outlet.

7. The substrate processing apparatus according to claim 1, wherein a length of a flow passage of the upstream outlet is shorter than a length of a flow passage of the downstream outlet.

8. The substrate processing apparatus according to claim 1, further comprising: controlling means for performing a control to alternately supply two or more types of reaction gases from the supply port plural times and to sandwich supply of purge gas between the alternate supplies of the two or more types of reaction gases.

9. The substrate processing apparatus according to claim 1, wherein at least two or more of the outlets are provided at least on the downstream side of the substrate on the plate, and the outlets are arrayed at an interval toward a gas flow direction.

10. A substrate processing apparatus, comprising:
    a processing chamber which processes a substrate;
    a holding tool which holds the substrate in the processing chamber;
    a plate provided on a periphery of the substrate;
    a supply port which is provided on a side of the substrate to communicate with a space above the plate, and supplies gas to the substrate;

outlets which are provided at least on an upstream side and downstream side of the substrate on the plate, and discharge the gas to a space below the plate; and an exhaust port which is provided on an opposite side to the supply port with the substrate sandwiched therebetween, communicates with the space below the plate, and exhausts the gas in the processing chamber, wherein the outlet provided at least on the downstream side of the substrate on the plate includes at least a first outlet, and a second outlet provided downstream of the first outlet.

11. A method for manufacturing a semiconductor device, comprising the steps of:

carrying a substrate into a processing chamber;

processing the substrate carried into the processing chamber in a manner of discharging gas from outlets provided at least on an upstream side and downstream side of the substrate on a plate provided on a periphery of the substrate to a space below the plate while supplying the gas to the substrate along the plate from a side of the substrate, and in a manner of exhausting the gas from an opposite side in a space below the plate, the opposite side being opposite to a supply side with the substrate sandwiched therebetween; and carrying out the processed substrate from the processing chamber, wherein, in the step of processing the substrate, conductance of the upstream outlet is made larger than conductance of the downstream outlet.

12. The method for manufacturing a semiconductor device according to claim 11, wherein, in the step of processing the substrate, two or more types of reaction gases are alternately supplied to the substrate plural times, and supply of purge gas is sandwiched between the alternate supplies of the two or more types of reaction gases.

13. The method for manufacturing a semiconductor device according to claim 11, wherein the step of processing the substrate includes the steps of: adsorbing at least one type of reaction gas onto the substrate; and supplying reaction gas different from the adsorbed reaction gas thereto, thereby generating a film-forming reaction.

14. The method for manufacturing a semiconductor device according to claim 11, wherein the step of supplying first reaction gas to the substrate and adsorbing the first reaction gas onto the substrate, the step of subsequently performing purge, the step of subsequently supplying second processing gas to the first reaction gas adsorbed onto the substrate, thereby generating a film-forming reaction, and the step of subsequently performing purge are repeated plural times in the step of processing the substrate.

15. The method for manufacturing a semiconductor device according to claim 11, wherein the step of processing the substrate includes the steps of: decomposing at least one type of reaction gas and depositing a thin film on the substrate; and supplying reaction gas different from the reaction gas to the deposited thin film and modifying the thin film.

16. The method for manufacturing a semiconductor device according to claim 11, wherein the step of supplying first reaction gas to the substrate and depositing a thin film on the substrate, the step of subsequently performing purge, the step of subsequently supplying second reaction gas to the thin film deposited on the substrate and modifying the thin film, and the step of subsequently performing purge are repeated plural times in the step of processing the substrate.

17. The method for manufacturing a semiconductor device according to claim 11, wherein a plurality of the outlets are provided at least on the downstream side of the substrate on the plate, the plurality of outlets are arrayed at an interval toward a gas flow direction, and the gas is discharged from the plurality of outlets in the step of processing the substrate.

* * * * *